US010392698B2

(12) United States Patent
Kaneko et al.

(10) Patent No.: US 10,392,698 B2
(45) Date of Patent: Aug. 27, 2019

(54) FILM FORMING METHOD, FILM FORMING SYSTEM AND SURFACE PROCESSING METHOD

(71) Applicant: Tokyo Electron Limited, Tokyo (JP)

(72) Inventors: Miyako Kaneko, Nirasaki (JP); Naotaka Noro, Nirasaki (JP); Tsuyoshi Takahashi, Nirasaki (JP); Kazuyoshi Yamazaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

(21) Appl. No.: 15/667,817

(22) Filed: Aug. 3, 2017

(65) Prior Publication Data
US 2018/0037989 A1 Feb. 8, 2018

(30) Foreign Application Priority Data
Aug. 5, 2016 (JP) .................................. 2016-154425

(51) Int. Cl.
*C01C 1/00* (2006.01)
*C01G 23/02* (2006.01)
(Continued)

(52) U.S. Cl.
CPC ........ *C23C 16/402* (2013.01); *C23C 16/0227* (2013.01); *C23C 16/0272* (2013.01); *C23C 16/30* (2013.01); *C23C 16/34* (2013.01); *C23C 16/45525* (2013.01); *C23C 16/45531* (2013.01); *C23C 16/54* (2013.01); *C23C 28/04* (2013.01); *C23C 28/042* (2013.01); *C01C 1/00* (2013.01); *C01G 23/022* (2013.01)

(58) Field of Classification Search
CPC . C23C 16/34; C23C 16/45525; C23C 16/401; C23C 16/0272; C23C 16/30; C23C 16/0227; C23C 28/042; C23C 16/54; C23C 16/45531; H01L 21/0228
See application file for complete search history.

(56) References Cited

U.S. PATENT DOCUMENTS

| 6,548,398 B1* | 4/2003 | Yamasaki | ............. H01L 21/321 257/E21.3 |
| 2003/0168001 A1* | 9/2003 | Sneh | ........................ C23C 16/02 117/86 |
| 2015/0171179 A1 | 6/2015 | Horii et al. | |

FOREIGN PATENT DOCUMENTS

| JP | 06-188205 A | 7/1994 |
| JP | 2003-077864 A | 3/2003 |
| | (Continued) | |

*Primary Examiner* — Jasmine J Clark
(74) *Attorney, Agent, or Firm* — Pearne & Gordon LLP

(57) ABSTRACT

A metal-containing film can be formed with high continuity with respect to a base when forming the metal-containing film on the base by CVD or ALD. A film forming method of forming, by ALD or CVD, a Ti-containing film on a base film of a processing target object having a $SiO_2$ film as the base film includes performing a surface processing of accelerating formation of a silanol group on a surface of the $SiO_2$ film by bringing a fluid containing O and H into contact with the surface of the $SiO_2$ film; and performing a film forming processing of forming the Ti-containing film on the $SiO_2$ film, on which the surface processing is performed, by the ALD or the CVD with a Ti source gas which reacts with the silanol group.

15 Claims, 16 Drawing Sheets

(51) Int. Cl.
*C23C 16/02* (2006.01)
*C23C 16/30* (2006.01)
*C23C 16/34* (2006.01)
*C23C 16/40* (2006.01)
*C23C 16/54* (2006.01)
*C23C 28/04* (2006.01)
*C23C 16/455* (2006.01)

(56) References Cited

FOREIGN PATENT DOCUMENTS

| | | |
|---|---|---|
| KR | 10-2004-0042258 A | 5/2004 |
| KR | 10-2014-0076514 A | 6/2014 |

\* cited by examiner

FILM FORMING METHOD, FILM FORMING SYSTEM AND SURFACE PROCESSING METHOD

CROSS-REFERENCE TO RELATED APPLICATION

This application claims the benefit of Japanese Patent Application No. 2016-154425 filed on Aug. 5, 2016, the entire disclosures of which are incorporated herein by reference.

TECHNICAL FIELD

The embodiments described herein pertain generally to a film forming method and a film forming system of forming a metal-containing film on a base of a processing target object by CVD or ALD, and a surface processing method.

BACKGROUND

In a manufacturing process of a semiconductor device, a metal-containing film such as a TiN film is used as a barrier film or an electrode such as a lower electrode of a DRAM, for example.

The TiN film is formed on a base such as a $SiO_2$ film or the like. As a film forming method therefor, there is known a chemical vapor deposition (CVD) or an atomic layer deposition (ALD).

In case of forming the TiN film by the CVD or ALD, however, the TiN film is required to be continuous with the base such as the $SiO_2$ film. According to the investigation of the present inventors, however, it was found out that there may occur a problem in the continuity of the TiN film depending on a surface state of the base, so that a pin hole or the like is formed.

SUMMARY

In view of the foregoing, exemplary embodiments provide a film forming method and a film forming system capable of forming a metal-containing film with high continuity with respect to a base when forming the metal-containing film on the base by CVD or ALD, and also provide a surface processing method capable of forming the metal-containing film on the base with such high continuity.

In a first exemplary embodiment, there is provided a film forming method of forming a metal-containing film on a base of a processing target object by ALD or CVD. The film forming method includes performing a surface processing of accelerating formation of a group containing OH on a surface of the base of the processing target object by bringing a fluid containing O and H into contact with the surface of the base; and performing a film forming processing of forming the metal-containing film on the base, on which the surface processing is performed, by the ALD or the CVD with a film forming source material which reacts with the group containing OH.

Here, the base may be a base film formed on a substrate and the base film may be an oxide film. Further, the base film may be a $SiO_2$ film, and in this case, the group containing OH may be a silanol group. Furthermore, the base may be silicon, and in this case, the group containing OH may be a silanol group.

The metal-containing film may be a Ti-containing film, and in this case, the metal-containing film may be a TiN film or a TiBN film.

In a second exemplary embodiment, there is provided a film forming method of forming, by ALD or CVD, a Ti-containing film on a base film of a processing target object having a $SiO_2$ film as the base film. The film forming method includes performing a surface processing of accelerating formation of a silanol group on a surface of the $SiO_2$ film by bringing a fluid containing O and H into contact with the surface of the $SiO_2$ film; and performing a film forming processing of forming the Ti-containing film on the $SiO_2$ film, on which the surface processing is performed, by the ALD or the CVD with a Ti source gas which reacts with the silanol group.

Here, the Ti source gas may be $TiCl_4$, and it is desirable that the Ti-containing film is formed by a condensation reaction of the silanol group with the $TiCl_4$. Further, the Ti-containing film may be a TiN film formed by using the Ti source gas and a nitriding gas. Furthermore, the Ti-containing film may be a TiBN film formed by using the Ti source gas, a B source gas and a nitriding gas. The nitriding gas may be $NH_3$.

In the first and the second exemplary embodiments, the performing of the surface processing may be implemented by a wet processing in which a preset aqueous solution as the fluid containing O and H is used and the preset aqueous solution is brought into contact with the surface of the base. In this case, the preset aqueous solution may be selected from a mixed aqueous solution of ammonia water and hydrogen peroxide, a mixed aqueous solution of hydrochloric acid and hydrogen peroxide, an aqueous solution of hydrogen peroxide and a mixed aqueous solution of sulfuric acid and hydrogen peroxide, and a wet cleaning processing may be performed as the wet processing. Further, the performing of the film forming processing is conducted within two hours after conducting the performing of the surface processing by the wet processing.

The performing of the surface processing may be implemented by a dry processing in which a preset processing gas as the fluid containing O and H is used and the preset processing gas is brought into contact with the surface of the base. In this case, the preset processing gas may be selected from a vapor of $H_2O_2$, a vapor of $O_3+H_2O$, and a high-temperature vapor of $H_2O$. Further, it is desirable that, after the performing of the surface processing by the dry processing, the performing of the film forming processing is conducted in-situ.

In a third exemplary embodiment, there is provided a film forming system of forming a metal-containing film on a base of a processing target object by ALD or CVD. The film forming system includes a surface processing apparatus configured to perform a surface processing of accelerating formation of a group containing OH on a surface of the base of the processing target object by bringing a fluid containing O and H into contact with the surface of the base; and a film forming apparatus configured to perform a film forming processing of forming the metal-containing film on the base, on which the surface processing is performed, by the ALD or the CVD with a film forming source material which reacts with the group containing OH.

In a fourth exemplary embodiment, there is provided a film forming system of forming, by ALD or CVD, a Ti-containing film on a base film of a processing target object having a $SiO_2$ film as the base film. The film forming system includes a surface processing apparatus configured to perform a surface processing of accelerating formation of a silanol group on a surface of the $SiO_2$ film by bringing a fluid containing O and H into contact with the surface of the $SiO_2$ film; and a film forming apparatus configured to perform a film forming processing of forming the Ti-containing film on the $SiO_2$ film, on which the surface processing is performed, by the ALD or the CVD with a Ti source gas which reacts with the silanol group.

In the third and the fourth exemplary embodiments, the surface processing apparatus may be configured to perform the surface processing by a wet processing in which a preset aqueous solution as the fluid containing O and H is used and the preset aqueous solution is brought into contact with the surface of the base. In this case, the surface processing apparatus may be configured to perform a wet cleaning processing as the wet processing by using the preset aqueous solution selected from a mixed aqueous solution of ammonia water and hydrogen peroxide, a mixed aqueous solution of hydrochloric acid and hydrogen peroxide, an aqueous solution of hydrogen peroxide and a mixed aqueous solution of sulfuric acid and hydrogen peroxide. The film forming system further includes a control unit configured to control the surface processing apparatus and the film forming apparatus. It is desirable that the control unit controls the film forming apparatus to perform the film forming processing within two hours after the surface processing apparatus performs the surface processing by the wet processing.

The surface processing apparatus may be configured to perform the surface processing by a dry processing in which a preset processing gas as the fluid containing O and H is used and the preset processing gas is brought into contact with the surface of the base. In this case, the surface processing apparatus may be configured to use one selected from a vapor of $H_2O_2$, a vapor of $O_3+H_2O$, and a high-temperature vapor of $H_2O$ as the preset processing gas.

When the surface processing is performed by the dry processing, the surface processing apparatus and the film forming apparatus perform a vacuum processing and are connected to a vacuum transfer chamber maintained in a vacuum level, and the surface processing and the film forming processing are sequentially performed in a vacuum atmosphere. The film forming system further includes a chamber maintained in a vacuum level; a placing table configured to place the processing target object thereon within the chamber; a device configured to supply a film forming gas into the chamber; a device configured to supply a preset processing gas for performing the surface processing; and a gas exhaust device configured to evacuate the chamber. The surface processing apparatus and the film forming apparatus may be configured as one body, and the surface processing and the film forming processing are performed within the chamber.

In a fifth exemplary embodiment, a surface processing method includes performing a surface processing of accelerating formation of a group containing OH on a surface of a base of a processing target object by bringing a fluid containing O and H into contact with the surface of the base prior to forming a metal-containing film on the base of the processing target object by ALD or CVD.

In a sixth exemplary embodiment, a surface processing method includes performing a surface processing of accelerating formation of a silanol group on a surface of a $SiO_2$ film as a base film of a processing target object by bringing a fluid containing O and H into contact with the surface of the $SiO_2$ film prior to forming a Ti-containing film on the base film of the processing target object by ALD or CVD.

According to the exemplary embodiments, the surface processing of accelerating the formation of the group containing OH is performed on the surface of the base by bringing the fluid containing O and H into contact with the surface of the base of the processing target object. Then, the metal-containing film is formed on the base by ALD or CVD with the film forming source material which reacts with the group containing OH. Therefore, the reaction between the group containing OH and the film forming source material takes place on the entire surface of the base, so that the metal-containing film can be formed with high continuity with respect to the base.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
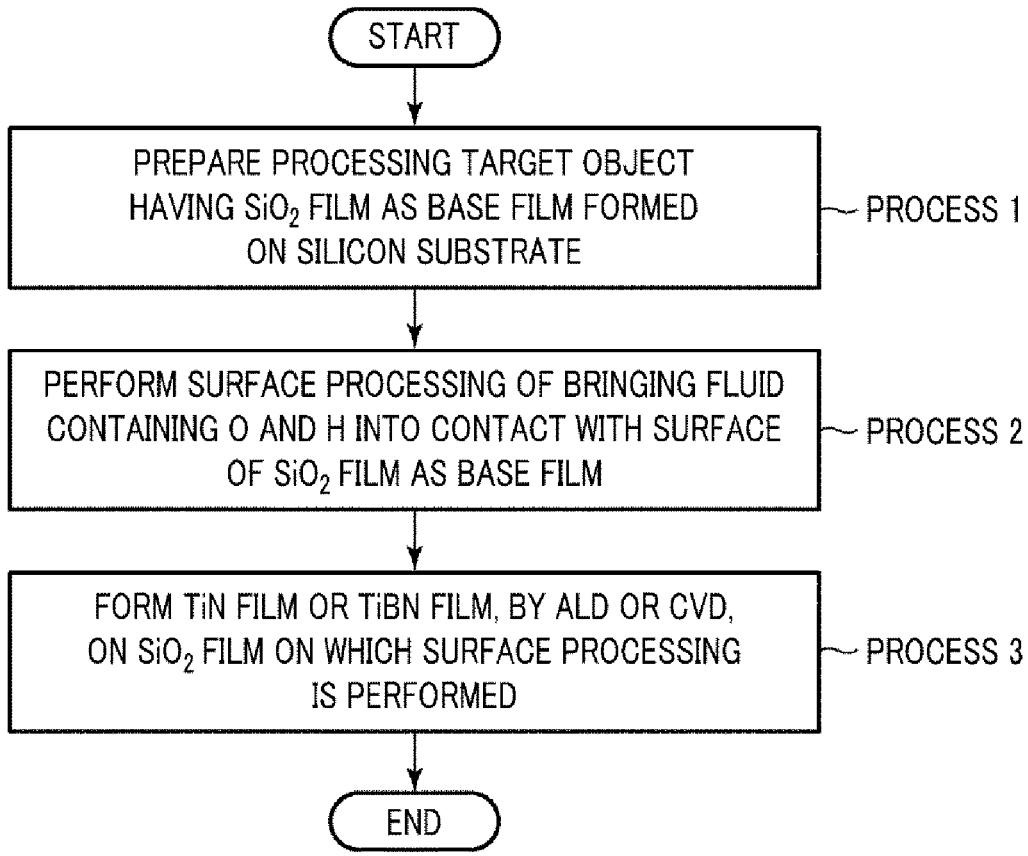
FIG. 1 is a flowchart for describing an exemplary embodiment of a film forming method according to the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

<Exemplary Embodiment of Film Forming Method>

First, an exemplary embodiment of a film forming method according to the present disclosure will be described.

FIG. 1 is a flowchart for describing the exemplary embodiment of the film forming method according to the present disclosure. Here, an example case of forming a TiN film or a TiBN film on a $SiO_2$ film as a base film by ALD will be discussed.

Figure 2:
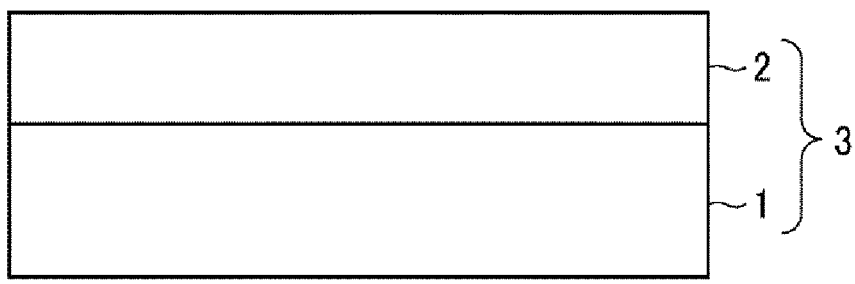
FIG. 2 is a cross sectional view illustrating a structure of a processing target object in the exemplary embodiment of the film forming method according to the present disclosure.

First, as shown in FIG. 2, a processing target object 3 having a $SiO_2$ film 2 as a base film formed on a silicon substrate 1 is prepared (process 1). The $SiO_2$ film 2 may be a thermal oxide film or a film formed by CVD using tetraethylorthosilicate (TEOS) or the like as a source material.

Then, a surface processing of bringing a fluid containing O and H into contact with a surface of the $SiO_2$ film 2 as the base film is performed (process 2). Through this surface processing, formation of a silanol group as a group containing OH on the surface of the $SiO_2$ film 2 is accelerated, so that the silanol group can be formed on the substantially entire surface of the $SiO_2$ film 2.

As the surface processing of the process 2, a wet processing using a preset aqueous solution may be appropriately used. As the aqueous solution for the wet processing, a chemical liquid typically used in a wet cleaning process, such as a mixed aqueous solution (ammonia/hydrogen peroxide: SC1) of ammonia water ($NH_4OH$) and hydrogen peroxide ($H_2O_2$), a mixed aqueous solution (hydrochloric acid/hydrogen peroxide: SC2) of hydrochloric acid (HCl) and hydrogen peroxide ($H_2O_2$), an aqueous solution of hydrogen peroxide ($H_2O_2$) or a mixed aqueous solution (sulfuric acid/hydrogen peroxide: SPM) of sulfuric acid ($H_2SO_4$) and hydrogen peroxide ($H_2O_2$), may be utilized. The wet processing is performed by bringing the aqueous solution into contact with the surface of the $SiO_2$ film, e.g., by immersing the processing target objet in the chemical liquid stored in a cleaning bath.

Through the processing with the chemical liquid for the wet cleaning, not only the silanol group as the group containing the OH group can be formed in the entire surface of the $SiO_2$ film 2 as the base film, but a particle, a metal impurity, an organic material can also be removed from the surface of the processing target object (that is, the surface of the $SiO_2$ film) before subjected to the film formation. Thus, the processing target object having the clean surface can be obtained. By way of non-limiting example, the SC1 may be employed for removing the particle or the organic material; the SC2, for removing the metal impurity; the hydrogen peroxide ($H_2O_2$), for removing the metal impurity or the organic material.

The surface processing of the process 2 may be performed by using pure water, instead of conducting the above-described wet cleaning processing.

Furthermore, besides being implemented by the wet processing, the surface processing of the process 2 may be implemented by a dry processing using a processing gas containing O and H. The dry processing may be performed by using a vapor of $H_2O_2$, a vapor of $O_3+H_2O$, a high-temperature vapor of $H_2O$, or the like as the processing gas.

Figure 3:
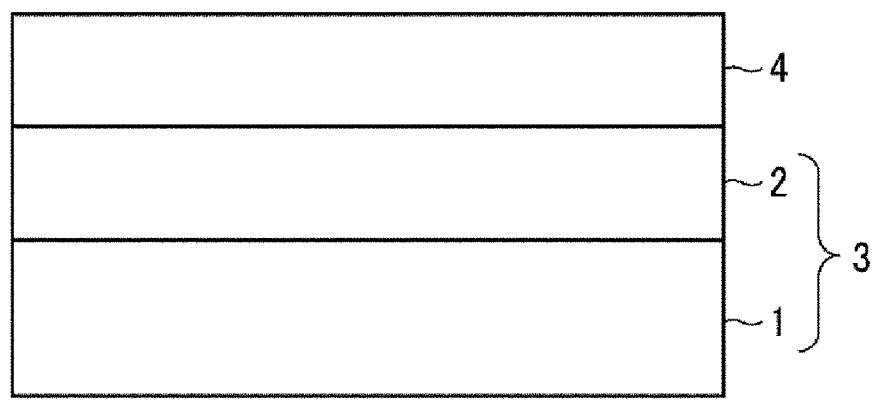
FIG. 3 is a cross sectional view illustrating a state in which a TiN film or a TiBN film is formed on the processing target object in the exemplary embodiment of the film forming method according to the present disclosure.

Then, as depicted in FIG. 3, a TiN film or a TiBN film 4 is formed, by ALD or CVD, on the $SiO_2$ film 2, on which the surface processing is performed (process 3). According to the present exemplary embodiment, in the film forming processing of the TiN film or the TiBN film of the process 3, a $TiCl_4$ gas may be used as a Ti source gas; a $NH_3$ gas, as a nitriding gas; and a $BCl_3$ gas, as a B source gas, for example.

Figure 4:
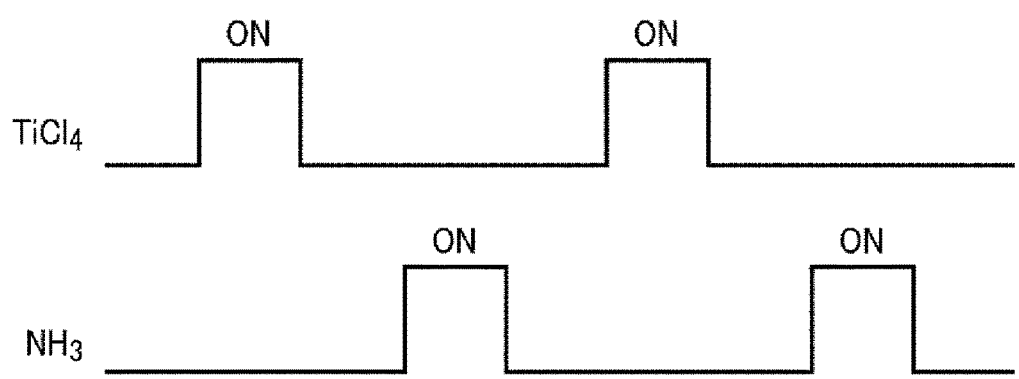
FIG. 4 is a diagram showing a sequence when forming the TiN film by ALD.

In case of forming the TiN film by the ALD, by supplying the $TiCl_4$ gas and the $NH_3$ gas alternately a preset number of times, as shown in FIG. 4, adsorption of a Ti layer as a monoatomic layer and nitriding of this Ti layer are repeated, so that the TiN film having a preset thickness is formed. After each supply of the $TiCl_4$ gas and each supply of the $NH_3$ gas, purge is performed to remove a gas remaining on the processing target object.

Figure 5:
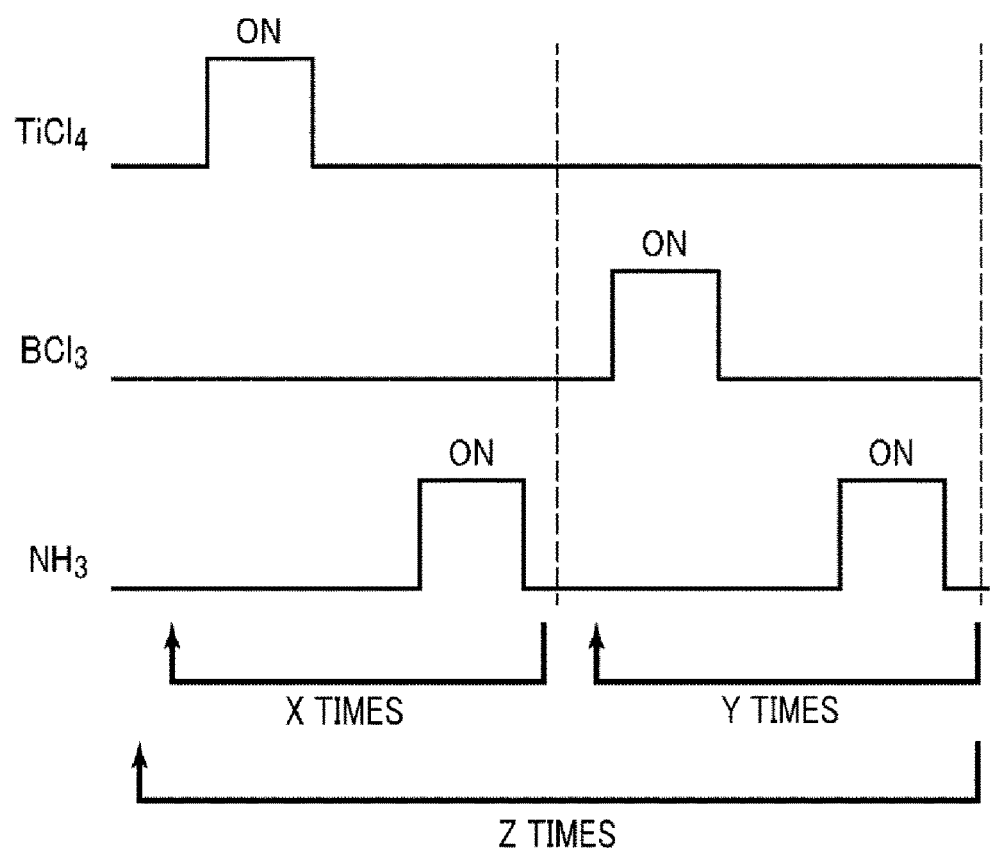
FIG. 5 is a diagram showing a sequence when forming the TiBN film by ALD.

Further, in case of forming the TiBN film by the ALD, as shown in FIG. 5, until a predetermined film thickness is obtained, a TiN film forming process of alternately repeating the supply of the $TiCl_4$ gas and the supply of the $NH_3$ gas X times and a BN film forming process of alternately repeating the supply of the $BCl_3$ gas and the supply of the $NH_3$ gas one time or Y times (Y is 2 or more) are repeated a preset number of times (Z times) such that a preset ratio between the TiN and the BN is acquired. Here, by adjusting the X and the Y, the ratio between the TiN and the BN is adjusted. By way of example, by setting X=10 and Y=1, the TiBN film having the ratio of TiN:BN=10:1 is obtained. After each supply of the $TiCl_4$ gas, each supply of the $BCl_3$ gas and each supply of the $NH_3$ gas, a processing of removing a gas remaining on the processing target object with an inert gas such as, but not limited to, a $N_2$ gas, for example, a purge processing is performed.

Meanwhile, in case of forming the TiN film or the TiBN film by the CVD, the $TiCl_4$ gas and the $NH_3$ gas, or the $TiCl_4$ gas, the $BCl_3$ gas and the $NH_3$ gas are supplied at the same time.

As conditions for the film forming processing of the process 3, it may be desirable to set a temperature to be in the range from 400° C. to 600° C. and a pressure to be in the range from 400 Pa to 800 Pa.

Meanwhile, according to the investigation of the present inventors, it is found out that if the TiN film or the like is formed on the $SiO_2$ film as the base film without performing the surface processing of the process 2, there may occur a problem in the continuity of the film depending on the surface state of the base, so that a pin hole or the like is formed.

Figure 6:
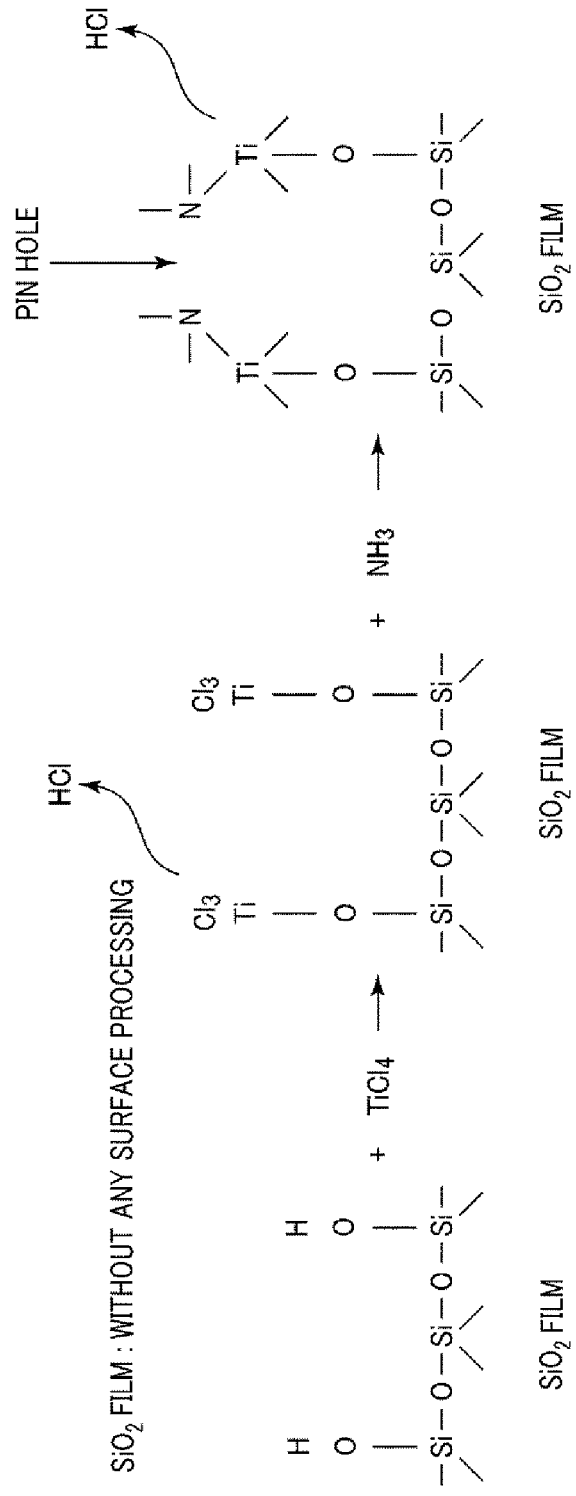
FIG. 6 is a diagram illustrating a reaction model of film formation in a state that a $SiO_2$ film as a base film is only formed without any surface processing.

That is, to allow the TiN or the like to be formed on the $SiO_2$ film, the silanol group as the group containing the OH on the surface of the $SiO_2$ film needs to react with the $TiCl_4$ as the Ti source material. In the surface of the $SiO_2$ film which is only formed without any surface processing, however, the amount of the silanol group (OH) on the surface is not sufficient. Further, as shown in FIG. 6, at a portion on the surface where no silanol group (OH) exists, no reaction with the $TiCl_4$ may occur, so that it may be difficult for the Ti to be adsorbed to that portion. Thus, even after the nitriding is performed thereon, TiN may not be obtained but the pin hole may be formed at that portion.

In view of this problem, in the present exemplary embodiment, formation of the TiN film or the like is performed after performing the surface processing of accelerating the formation of the silanol group as the group containing OH by bringing the fluid containing O and H into contact with the surface of the $SiO_2$ film.

Figure 7:
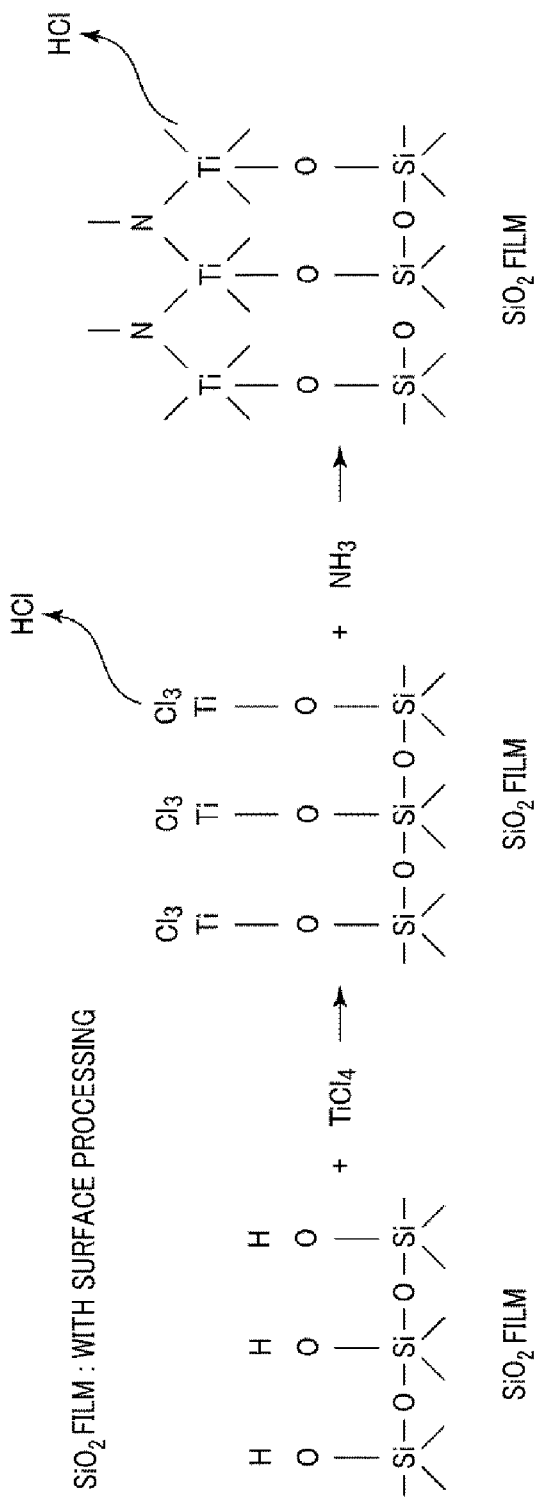
FIG. 7 is a diagram illustrating a reaction model of the film formation in a state that a surface processing is performed on the $SiO_2$ film as the base film.

Accordingly, as depicted in FIG. 7, the silanol group containing OH as a reaction site can be formed on the substantially entire surface of the $SiO_2$ film. Thus, in the entire surface of the $SiO_2$ film, a condensation reaction of the silanol group with the $TiCl_4$ is accelerated, so that Ti can be adsorbed to the substantially entire surface of the $SiO_2$ film. Therefore, no pin hole is formed, and the TiN film or the like can be uniformly formed on the substantially entire surface.

When performing the surface processing of the process 2 by the wet processing, it is desirable to perform the film forming processing of the process 3 within two hours after the surface processing is finished. Within the two hours, it is possible to form the TiN film or the TiBN film while maintaining the state where the silanol group as the group containing OH is formed on the substantially entire surface of the $SiO_2$ film which is the base film.

When performing the surface processing of the process 2 by the dry processing, it is desirable to perform the surface processing and the subsequent film forming processing in-situ.

EXPERIMENTAL EXAMPLES

Now, experimental examples will be described.

Experimental Example 1

Here, in case of forming the TiBN film (TiN:BN=20:1) or the TiN film on the $SiO_2$ film by the ALD, the continuity of the formed film is investigated for each of a case where the surface processing by the wet cleaning (SC1 (ammonia/hydrogen peroxide)) is performed before the film formation and a case where the surface processing is not performed.

The continuity of the film is evaluated by counting Si ions through SIMS after the film formation. As for the Si ion count, an ion count at a time when each of a thickness of the TiBN film and a thickness of the TiN film is 30 nm is defined to be a background of Si (Si B.G). If the Si ion count is larger than the Si B.G after the film formation, it means that the $SiO_2$ film as the base is detected, which indicates that the pin hole or the like is formed.

Figure 8:
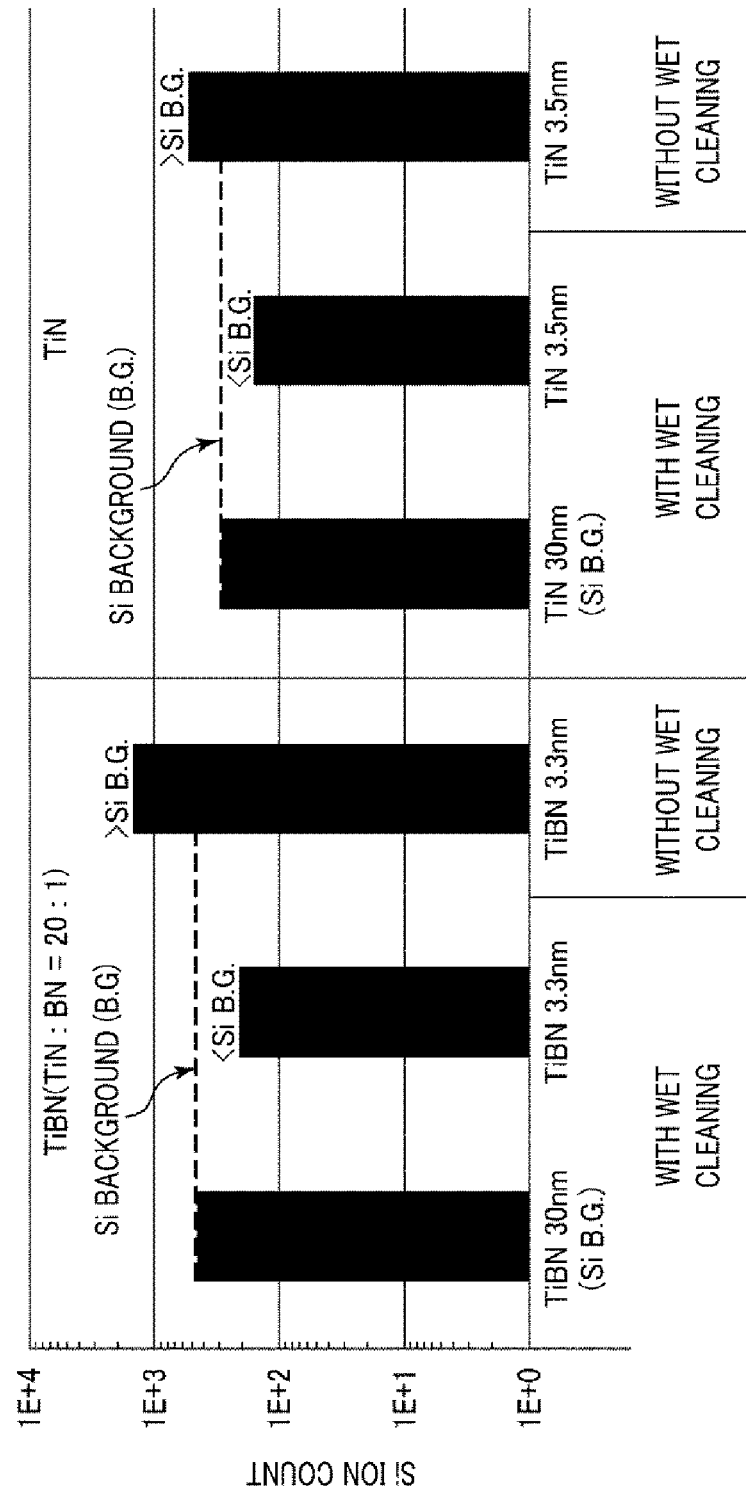
FIG. 8 is a diagram showing a Si ion count by SIMS when the TiN film or the TiBN film is formed in each of a case where wet cleaning is performed and a case where the wet cleaning is not performed in an experimental example 1.

A result is shown in FIG. 8. As shown in FIG. 8, if the wet cleaning is performed before the film formation, the Si ion count is equal to or less than the background, whereas if the wet cleaning is not performed, the Si ion count exceeds the background. In view of this result, it is found out that the continuity of the film is improved by performing the wet cleaning of the $SiO_2$ film before the film formation.

Experimental Example 2

Here, in case of forming the TiN film or the TiBN film containing BN in various amounts (TiN:BN=10:1, 20:1 and 60:1) on the $SiO_2$ film by the ALD, a film thickness and an in-surface uniformity $3\sigma$ of the film thickness are investigated for each of the case where the surface processing by the wet cleaning (SC1 (ammonia/hydrogen peroxide)) is performed before the film formation and the case where the surface processing is not performed. The film thickness is measured by an ellipsometry.

Figure 9:
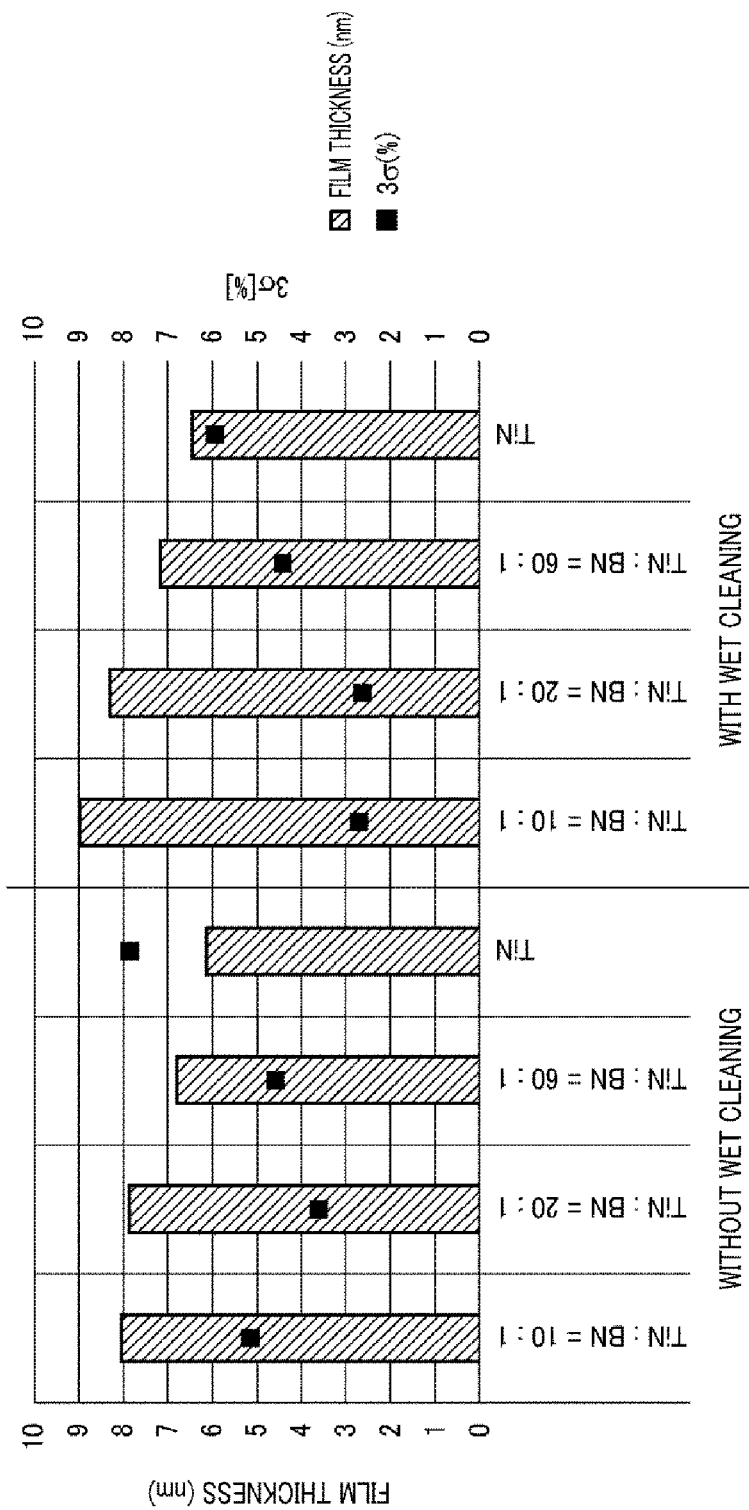
FIG. 9 is a diagram showing a film thickness and an in-surface uniformity 3σ of the film thickness when the TiN film or the TiBN film containing BN in various amounts (TiN:BN=10:1, 20:1 and 60:1) is formed in each of the case where the wet cleaning is performed and a case where the wet cleaning is not performed in an experimental example 2.

A result is shown in FIG. 9. As can be seen from this figure, it is found out that the uniformity of the film is improved by performing the wet cleaning prior to the film formation.

Experimental Example 3

Here, in case of forming the TiN film on the $SiO_2$ film by the ALD, an incubation cycle is investigated for each of the case where the surface processing by the wet cleaning (SC1 (ammonia/hydrogen peroxide)) is performed before the film formation and the case where the surface processing is not performed. A film thickness is measured by X-ray fluorescence spectrometry (XRF).

Figure 10:
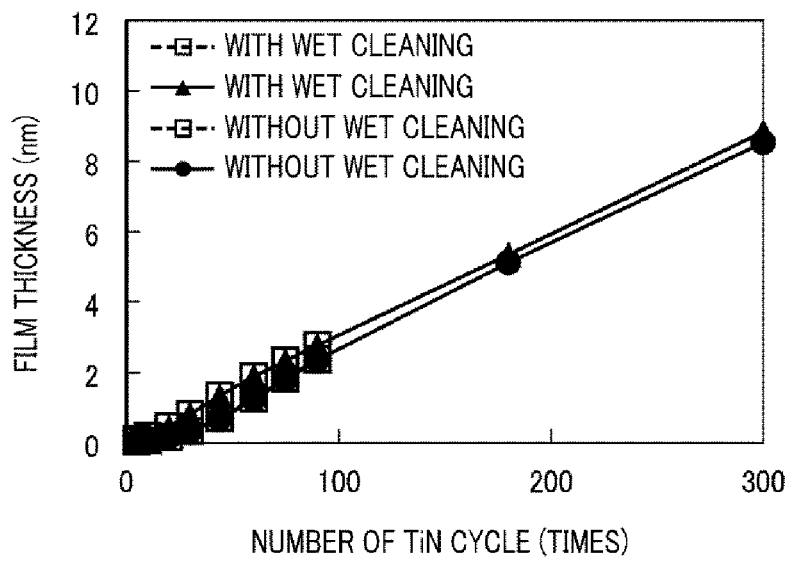
FIG. 10 is a diagram showing an incubation cycle of the TiN film in each of a case where the wet cleaning is performed and a case where the wet cleaning is not performed in an experimental example 3.
Figure 11:
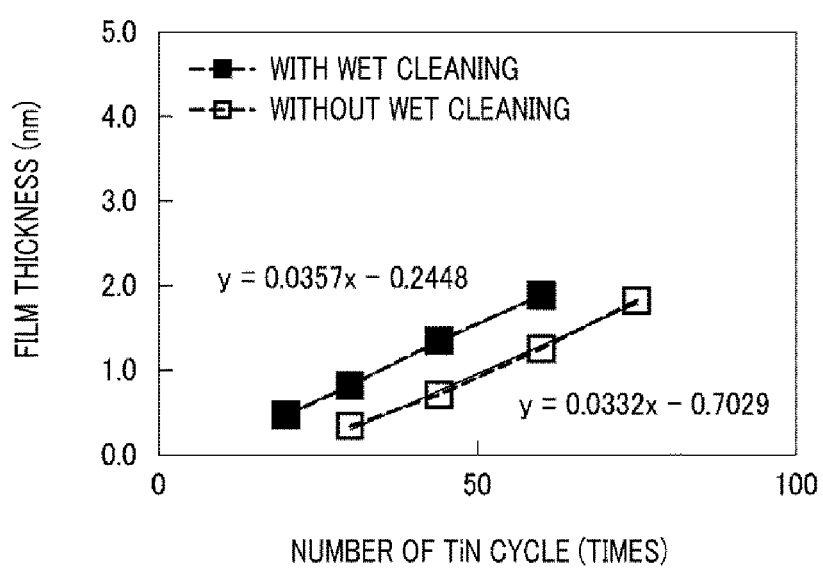
FIG. 11 is a diagram showing an enlarged view of a chart up to about 70 cycles in FIG. 10.

A result is shown in FIG. 10 and FIG. 11. FIG. 10 is a diagram showing the film thickness up to 300 cycles, and FIG. 11 is a diagram showing an enlarged view of a chart up to about 70 cycles in FIG. 10. As can be seen from these diagrams, the incubation cycle is found to be shortened by performing the wet cleaning prior to the film formation. That is, it is found out that the continuous film can be formed at an early stage by forming a lot of silanol group as the group containing OH on the surface of the $SiO_2$ film through the wet cleaning.

<Film Forming System>

Now, a film forming system that can be used in the film forming method of the present exemplary embodiment will be explained.

First Example

Figure 12:
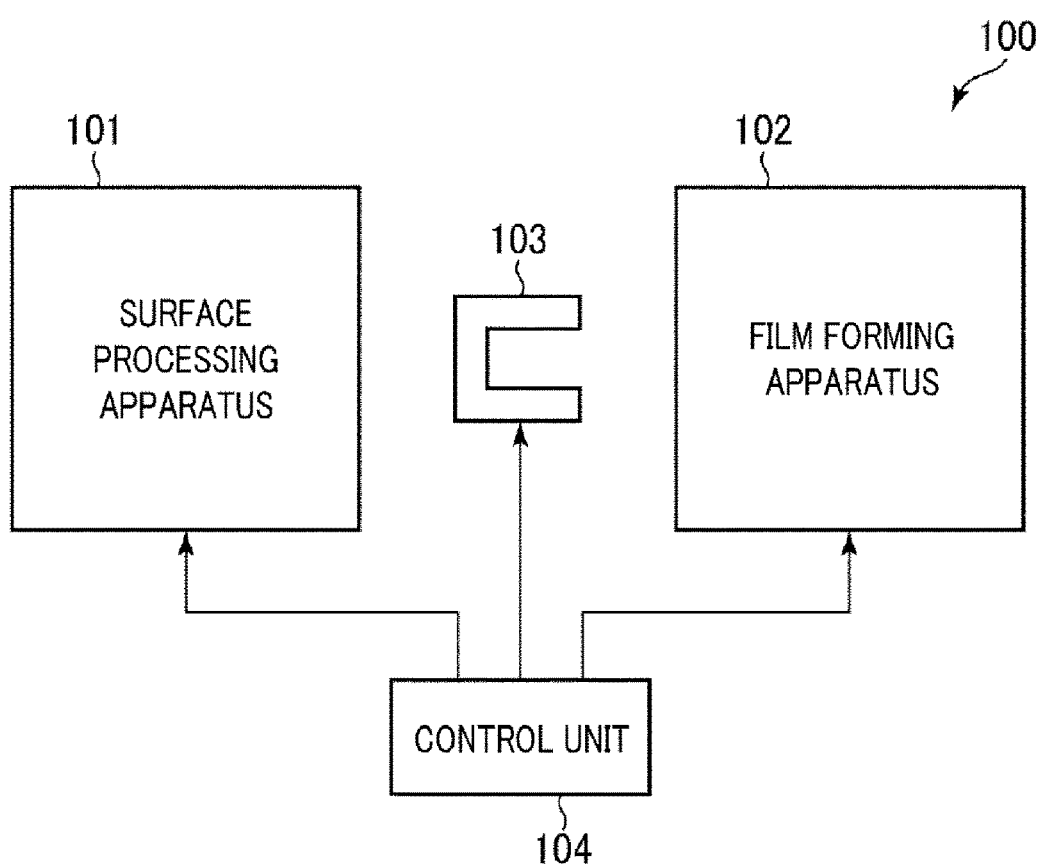
FIG. 12 is a block diagram illustrating a first example of a film forming system applicable to the film forming method according to the present disclosure.

FIG. 12 is a block diagram showing a first example of a film forming system.

As illustrated in FIG. 12, a film forming system 100 of the present example includes a surface processing apparatus 101 configured to perform a surface processing by wet cleaning on a semiconductor wafer (hereinafter, simply referred to as "wafer") having a $SiO_2$ film as a base film formed on a silicon substrate as a processing target object; a film forming apparatus 102 configured to form, by ALD, a TiN film on a surface of the $SiO_2$ film on which the surface processing is performed; a carrier transfer device 103 configured to transfer a carrier accommodating wafers therein between the surface processing apparatus 101 and the film forming apparatus 102; and a control unit 104 configured to control these individual components.

The control unit 104 includes a main controller having a CPU (computer) configured to control the surface processing apparatus 101, the film forming apparatus 102 and the carrier transfer device 103; an input device (a key board, a mouse, etc.); an output device (printer, etc.); a display device (a display, etc.); a storage device; and so forth. By setting a recording medium storing therein a processing recipe in the storage device, the main controller controls the film forming system 100 to perform preset operations based on the processing recipe retrieved from the recording medium, so that the preset operations are performed in the film forming system 100 under the control of the CPU (computer).

Figure 13:
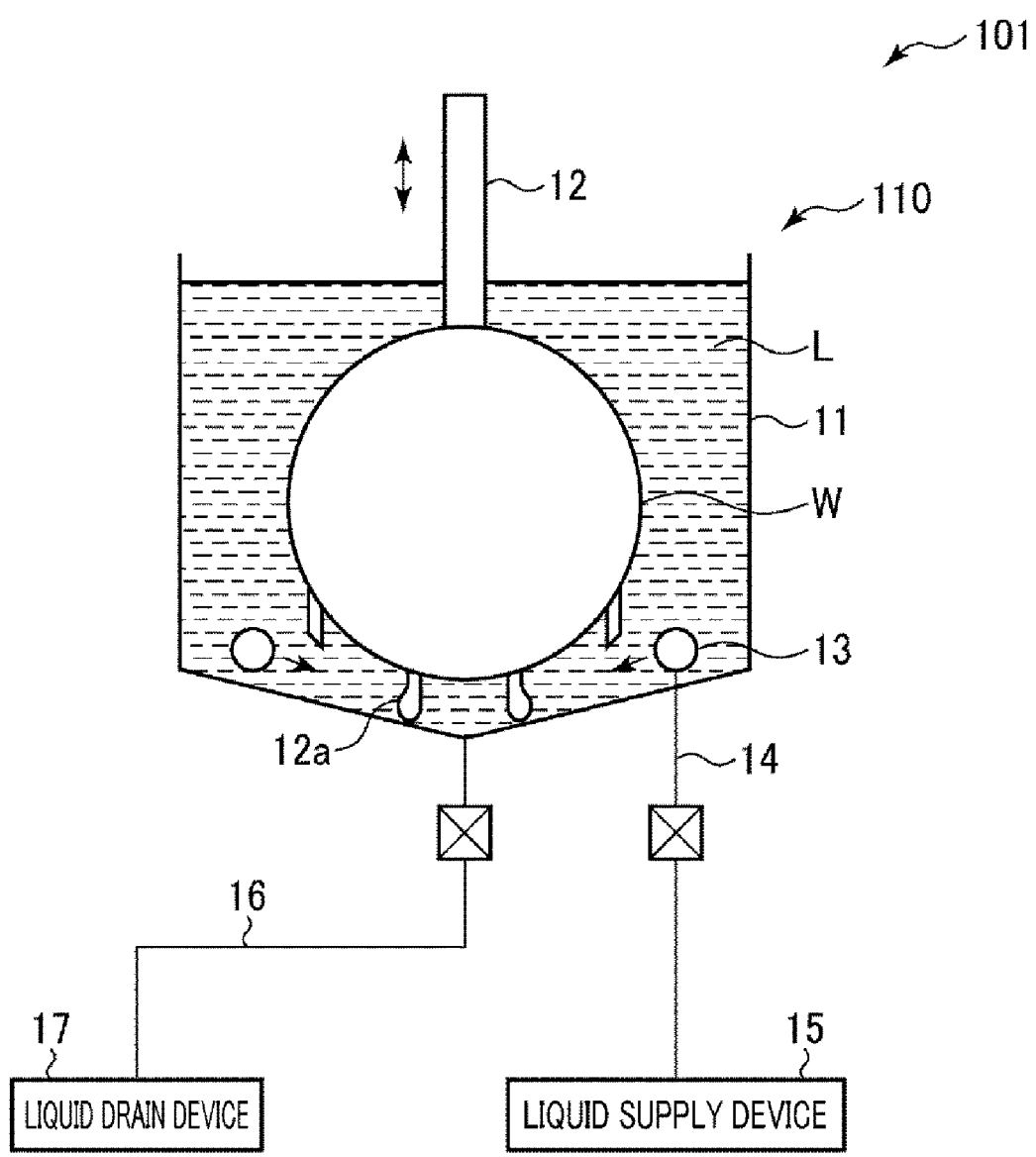
FIG. 13 is a cross sectional view illustrating an example of a surface processing apparatus in the film forming system of FIG. 12.

The surface processing apparatus 101 is configured as a wet cleaning apparatus as an atmospheric pressure system of a batch type. As depict in FIG. 13, the surface processing apparatus 101 includes a cleaning unit 110. Besides, though not shown, the surface processing apparatus 101 also includes a carry-in/out unit configured to carry a carrier accommodating therein a plurality of wafers in and out; a transfer device configured to transfer a wafer taken out of the carrier in the carry-in/out unit; and a drying apparatus configured to dry the wafer.

The cleaning unit 110 is equipped with a liquid processing bath 11 in which a liquid L is stored and a processing is performed. Multiple wafers held by a wafer holding member 12 are immersed in the liquid L stored in the liquid processing bath 11. The wafer holding member 12 is provided with a plurality of wafer holing rods 12a, and the multiple wafers W are held by these wafer holding rods 12a. The wafer holding member 12 is configured to be moved vertically and horizontally by a transfer device (not shown) to transfer the wafers W held thereat.

A nozzle 13 is provided within the liquid processing bath 11, and a liquid supply line 14 is connected to the nozzle 13. A chemical liquid for performing a surface processing, a rinse liquid, pure water (DIW) and so forth are supplied into the liquid supply line 14 from a liquid supply device 15. The chemical liquid for performing the surface processing may be, for example, SC1, SC2, an aqueous solution of $H_2O_2$, SPM, or the like, as mentioned above. The rinse liquid and the pure water (DIW) are used to clean the wafer W on which the chemical liquid processing is already performed.

A liquid drain line 16 is connected to a bottom portion of the liquid processing bath 11, and the liquid within the liquid processing bath 11 is drained through the liquid drain line 16 by a liquid drain device 17.

Further, the chemical liquid stored in the liquid processing bath 11 can be agitated by a non-illustrated agitator. Further, a temperature of the chemical liquid for performing the surface processing is adjustable within a range from a room temperature to about 80° C.

In the surface processing apparatus 101 having the above-described configuration, in a state that the chemical liquid for performing the surface processing is stored in the liquid processing bath 11 of the cleaning unit 110, the multiple wafers transferred by the transfer device while being held by the wafer holding member 12 are immersed and maintained in the chemical liquid in the liquid processing bath 11 for a preset time period. At this time, the chemical liquid may be agitated by the agitator, when necessary.

As a result, formation of a silanol group on a surface of a $SiO_2$ film, as the base film, formed on each wafer W is accelerated, so that the silanol group can be formed on the substantially entire surface of the $SiO_2$ film.

Upon the completion of the surface processing with the chemical liquid, the liquid within the liquid processing bath 11 is drained, and a rinse processing with the rinse liquid and a processing with the pure water are subsequently performed.

Thereafter, the wafer holding member 12 is raised up from the liquid processing bath 11 by the transfer device, and the drying processing is performed in the drying apparatus (not shown).

Further, in the surface processing apparatus 101, the surface processing is implemented by the wet cleaning processing, the control unit 104 controls a film forming processing to be performed within two hours after the surface processing is completed.

The film forming apparatus 102 is configured as a vacuum processing apparatus of a single wafer type, and is connected to a vacuum transfer chamber (not shown) of a vacuum processing system. A wafer W is carried into and out of the film forming apparatus 102 through a load lock chamber (not shown) from a carrier which accommodates wafers therein.

Figure 14:
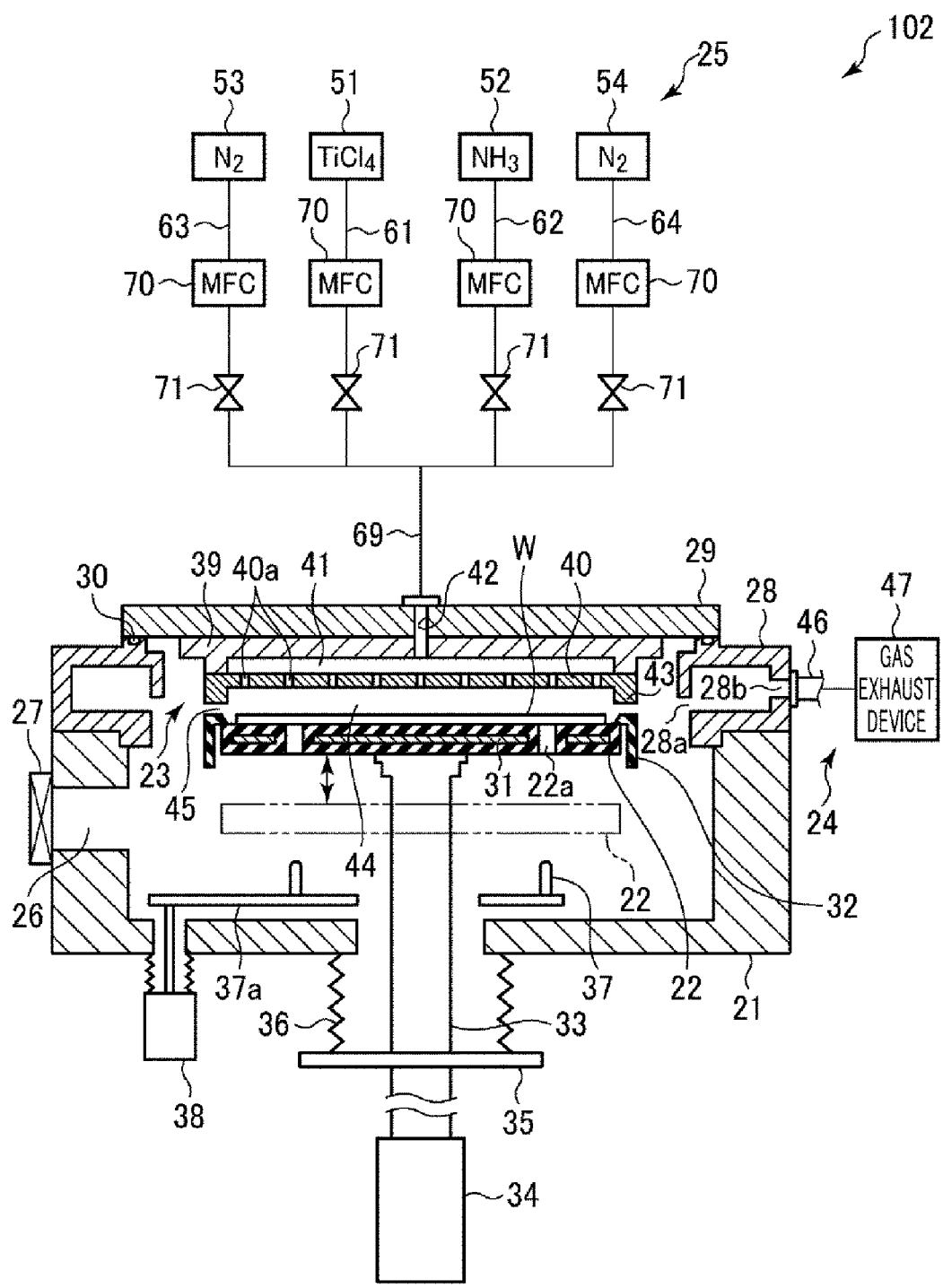
FIG. 14 is a cross sectional view illustrating a film forming apparatus in the film forming system of FIG. 12.

The film forming apparatus 102 includes, as illustrated in FIG. 14, a chamber 21, a susceptor 22 configured to support the wafer W horizontally within the chamber 21; a shower head 23 configured to supply a processing gas into the chamber 21 in a shower shape; a gas exhaust unit 24 configured to evacuate the inside of the chamber 21; and a processing gas supply device 25 configured to supply the processing gas to the shower head 23.

The chamber 21 is made of a metal having a substantially cylindrical shape. Formed at a sidewall of the chamber 21 is a carry-in/out opening 26 through which a wafer W is carried into/out of the chamber 21 with respect to the vacuum transfer chamber by a transfer device (not shown). The carry-in/out opening 26 is opened/closed by a gate valve 27.

An annular gas exhaust duct 28 having a rectangular cross section is provided on a main body of the chamber 21. The gas exhaust duct 28 is provided with a slit 28a which is formed along an inner surface thereof. Further, a gas exhaust port 28b is formed at an outer wall of the gas exhaust duct 28. Further, a ceiling wall 29 is provided on a top surface of the gas exhaust duct 28 to shield an upper opening of the chamber 21. A gap between the ceiling wall 29 and the gas exhaust duct 28 is hermetically sealed by a seal ring 30.

The susceptor 22 has a circular plate shape having a size corresponding to the wafer W and is supported by a supporting member 33. A heater 31 configured to heat the wafer W is embedded within the susceptor 22. The heater 31 is configured to generate heat by a power fed from a heater power supply (not shown). By controlling an output of the heater 31, the wafer W can be controlled to have a predetermined temperature. The susceptor 22 is provided with a cover member 32 configured to cover an outer peripheral portion of a wafer placing surface and a side surface of the susceptor 22.

The supporting member 33 supporting the susceptor 22 is extended from a center of a bottom surface of the susceptor 22 to below the chamber 21 through a hole formed through a bottom wall of the chamber 21. A lower end of the supporting member 33 is connected to an elevating device 34. The susceptor 22 is movable up and down via the supporting member 33 by the elevating device 34 between a processing position shown in FIG. 14 and a transfer position where a wafer is allowed to be transferred. The transfer position is located under the processing position, as indicated by a dashed double-dotted line. A flange 35 is mounted to a portion of the supporting member 33 located under the chamber 21, and a bellows 36 configured to be expanded and contracted by an elevating motion of the susceptor 22 is provided between the bottom surface of the chamber 21 and the flange 35 to separate an atmosphere within the chamber 21 from the exterior air.

Three (only two of them are illustrated) wafer supporting pins 37 configured to be protruded above an elevation plate 37a are provided in the vicinity of the bottom surface of the chamber 21. The wafer supporting pins 37 are configured to be movable up and down via the elevation plate 37a by an elevating device 38 which is provided under the chamber 21. The wafer supporting pins 37 are configured to be protruded above and retracted below a top surface of the susceptor 22 by being inserted through through holes 22a formed in the susceptor 22 located at the transfer position. Thus, the transfer of the wafer W is performed between a wafer transfer device (not shown) and the susceptor 22.

The shower head 23 is provided to face the susceptor 22 and has a diameter substantially equal to that of the susceptor 22. The shower head 23 includes a main body 39 fixed to the ceiling wall 29 of the chamber 21; and a shower plate 40 provided under the main body 39 to be contacted thereto. A gas diffusion space 41 is formed between the main body 39 and the shower plate 40, and a gas inlet hole 42 formed through centers of the main body 39 and the ceiling wall 29 of the chamber 21 communicates with the gas diffusion space 41. An annular protrusion portion 43 protruding downwards is formed at a peripheral portion of the shower plate 40, and gas discharge holes 40a are formed at a flat surface of the shower plate 40 inside the annular protrusion portion 43.

In the state that the susceptor 22 is located at the processing position, a processing space 44 is formed between the shower plate 40 and the susceptor 22, and an annular gap 45 is formed as the annular protrusion portion 43 and a top surface of the cover member 32 of the susceptor 22 are placed close to each other.

The gas exhaust unit 24 includes a gas exhaust line 46 connected to the gas exhaust port 28b of the gas exhaust duct 28; and a gas exhaust device 47 which is connected to the gas exhaust line 46 and has a vacuum pump, a pressure control valve, and the like. In an operation, the gas within the chamber 21 reaches the gas exhaust duct 28 through the slit 28a, and then, is exhausted from the gas exhaust duct 28 through the gas exhaust line 46 by the gas exhaust device 47 of the gas exhaust unit 24.

The processing gas supply device 25 includes a $TiCl_4$ gas supply source 51 configured to supply a $TiCl_4$ gas as a Ti source gas; a $NH_3$ gas supply source 52 configured to supply a $NH_3$ gas as a nitriding gas; and a first $N_2$ gas supply source 53 and a second $N_2$ gas supply source 54 respectively configured to supply a $N_2$ gas as a purge gas. Further, the processing gas supply device 25 also includes a $TiCl_4$ gas supply line 61 extended from the $TiCl_4$ gas supply source 51; a $NH_3$ gas supply line 62 extended from the $NH_3$ gas supply source 52; a first $N_2$ gas supply line 63 extended from the first $N_2$ gas supply source 53; and a second $N_2$ gas supply line 64 extended from the second $N_2$ gas supply source 54. The $TiCl_4$ gas supply line 61, the $NH_3$ gas supply line 62, the first $N_2$ gas supply line 63 and the second $N_2$ gas supply line 64 are merged into a joint line 69, and the joint line 69 is connected to the aforementioned gas inlet hole 42. Each of the lines 61 to 64 is provided with a mass flow controller 70 and an opening/closing valve 71.

By intermittently opening and closing the opening/closing valves 71 of the $TiCl_4$ gas supply line 61 and the $NH_3$ gas supply line 62 alternately while keeping the opening/closing valves 71 of the first and second $N_2$ gas supply lines 63 and 64 opened constantly, a series of processes of a supply of the $TiCl_4$ gas→a purge of the inside of the chamber→a supply of the $NH_3$ gas→a purge of the inside of the chamber can be performed repeatedly.

Furthermore, there may be provided pipelines respectively branched from the first $N_2$ gas supply line 63 and the second $N_2$ gas supply line 64 and configured to increase a flow rate of the $N_2$ gas only when the purge is performed. With this configuration, the flow rate of the $N_2$ gas may be increased in the purge process. The purge gas is not limited to the $N_2$ gas but may be another inert gas such as an Ar gas.

Further, besides the $TiCl_4$, tetra(isopropoxy)titanium (TTIP), titanium tetrabromide ($TiBr_4$), titanium tetraiodide ($TiI_4$), tetrakis(ethylmethylamino)titanium (TEMAT), tetrakis(dimethylamino)titanium (TDMAT), tetrakis(diethylamino)titanium (TDEAT) may be used as the Ti source gas. Furthermore, besides the $NH_3$, monomethylhydrazine (MMH) may be used as the nitriding gas.

In the film forming apparatus 102 configured as described above, the gate valve 27 is first opened, and the wafer W is carried into the film forming apparatus 102 from the vacuum transfer chamber by the transfer device and is placed on the susceptor 22. After the transfer device is retreated, the gate valve 27 is closed, and the susceptor 22 is raised to the processing position. Subsequently, the inside of the chamber 21 is maintained in a predetermined decompressed state, and a temperature of the susceptor 22 is regulated to a preset temperature by the heater 31.

Then, by intermittently opening and closing the opening/closing valves 71 of the $TiCl_4$ gas supply line 61 and the $NH_3$ gas supply line 62 alternately while continuously supplying the $N_2$ gas into the processing space 44 from the first $N_2$ gas supply source 53 and the second $N_2$ gas supply source 54, a series of processes of the supply of the $TiCl_4$ gas→the purge of the inside of the chamber→the supply of the $NH_3$ gas→the purge of the inside of the chamber can be performed repeatedly. Accordingly, by repeating the adsorption of the Ti layer as the monoatomic layer and the nitriding of this Ti layer, the TiN film having a preset thickness is formed.

At this time, since the surface processing is already performed on the surface of the $SiO_2$ film on which the TiN film is to be formed, the silanol group as the group containing OH which is the reaction site is formed on the substantially entire surface of the $SiO_2$ film. Thus, since Ti can be adsorbed to the substantially entire surface, the pin hole is not formed and the TiN film or the like can be uniformly formed on the substantially entire surface.

Further, by providing the pipelines respectively branched from the first $N_2$ gas supply line 63 and the second $N_2$ gas supply line 64 and configured to increase the flow rate of the $N_2$ gas only when the purge is performed, it is possible to enhance the purge by increasing the flow rate of the $N_2$ gas when the purge process is performed. Therefore, the TiN film having a higher film quality can be obtained.

After the TiN film is formed by the ALD as described above, the inside of the chamber 21 is purged, and the susceptor 22 is lowered. Further, the gate valve 27 is opened, and the wafer W is carried out.

At this time, processing conditions are as follows, for example.

Figure 15:
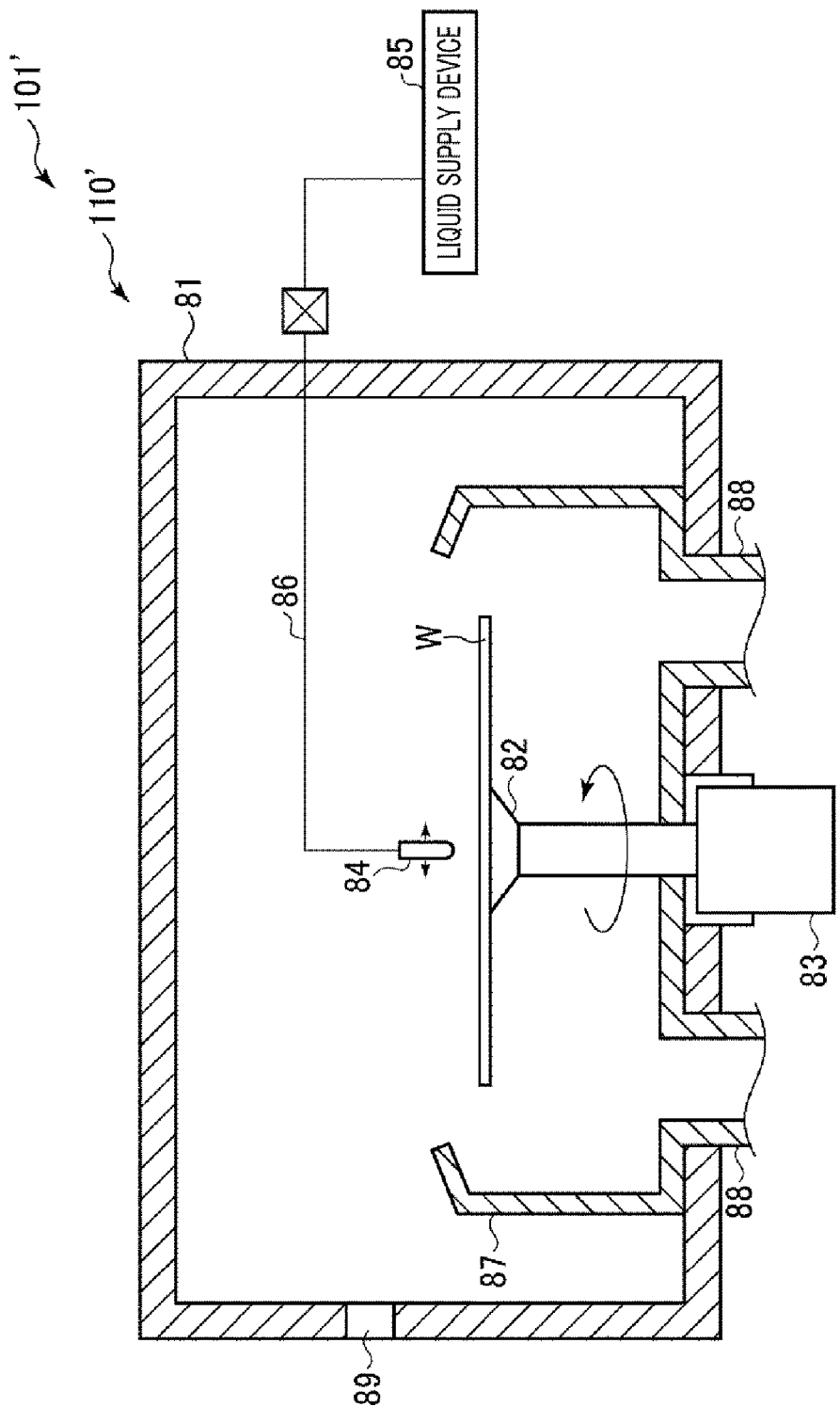
FIG. 15 is a cross sectional view illustrating another example of the surface processing apparatus in the film forming system of FIG. 12.

Pressure: 400 Pa~800 Pa
Temperature: 400° C.~600° C.
$TiCl_4$ gas flow rate: 50 sccm~100 sccm (mL/min)
$NH_3$ gas flow rate: 2000 sccm~5000 sccm (mL/min)
$N_2$ gas flow rate: 3000 sccm~6000 sccm (mL/min)
$TiCl_4$ gas supply time (per one time): 0.05 sec~0.1 sec
$NH_3$ gas supply time (per one time): 0.3 sec~0.5 sec
Purge time (per one time after $TiCl_4$): 0.2 sec~0.4 sec
Purge time (per one time after $NH_3$): 0.3 sec~0.6 sec As the film forming system 100, instead of the surface processing apparatus 101 implemented by the wet cleaning apparatus configured as the atmospheric pressure system of the batch type, there may be employed a surface processing apparatus 101' implemented by a wet cleaning apparatus configured as an atmospheric pressure system of the single wafer type, as shown in FIG. 15.

The surface processing apparatus 101' includes a cleaning unit 110' and a transfer device (not shown) configured to take a wafer out of the carrier which accommodates therein a plurality of wafers.

The cleaning unit 110' is equipped with a chamber 81; a spin chuck 82 configured to hold a wafer W rotatably within the chamber 81; a motor 83 configured to rotate the spin chuck 82; a nozzle 84 configured to discharge a liquid toward the wafer W held by the spin chuck 82; and a liquid supply device 85 configured to supply the liquid to the nozzle 84. The liquid is supplied from the liquid supply device 85 to the nozzle 84 through a liquid supply line 86. A chemical liquid for performing a surface processing, a rinse liquid, pure water (DIW) may be supplied from the liquid supply device 85. The chemical liquid for performing the surface processing may be, by way of non-limiting example, SC1, SC2, the aqueous solution of $H_2O_2$, SPM, or the like, as stated above. The rinse liquid and the pure water (DIW) may be used to clean the wafer W on which the chemical liquid processing is already performed.

Within the chamber 81, a cup 87 configured to cover the wafer W held by the spin chuck 82 is provided. A gas exhaust/liquid drain line 88 for gas exhaust and liquid drainage is provided at a bottom portion of the cup 87 and is extended to below the chamber 81. A carry-in/out opening 89 through which the wafer W is carried in and out is provided at a sidewall of the chamber 81.

To perform a cleaning processing by the cleaning unit 110' configured as described above, a single sheet of wafer W is carried into the chamber 81 by the transfer device (not shown) and is placed on the spin chuck 82. In this state, while rotating the wafer along with the spin chuck 82 by the motor 83, the chemical liquid is supplied to the nozzle 84 from the liquid supply device 85 through the liquid supply line 86, and then, is discharged toward the wafer W from the nozzle 84. The chemical liquid is maintained on the entire surface of the $SiO_2$ film of the wafer W for a preset time period. As a result, formation of a silanol group on the surface of the $SiO_2$ film, as the base film, formed on the wafer W can be accelerated, so that the silanol group can be formed on the substantially entire surface of the $SiO_2$ film.

After the surface processing with the chemical liquid is performed, a rinse processing and a pure water processing are performed by replacing the liquid with the rinse liquid and the pure water in sequence. Finally, drying by scattering is performed.

Figure 16:
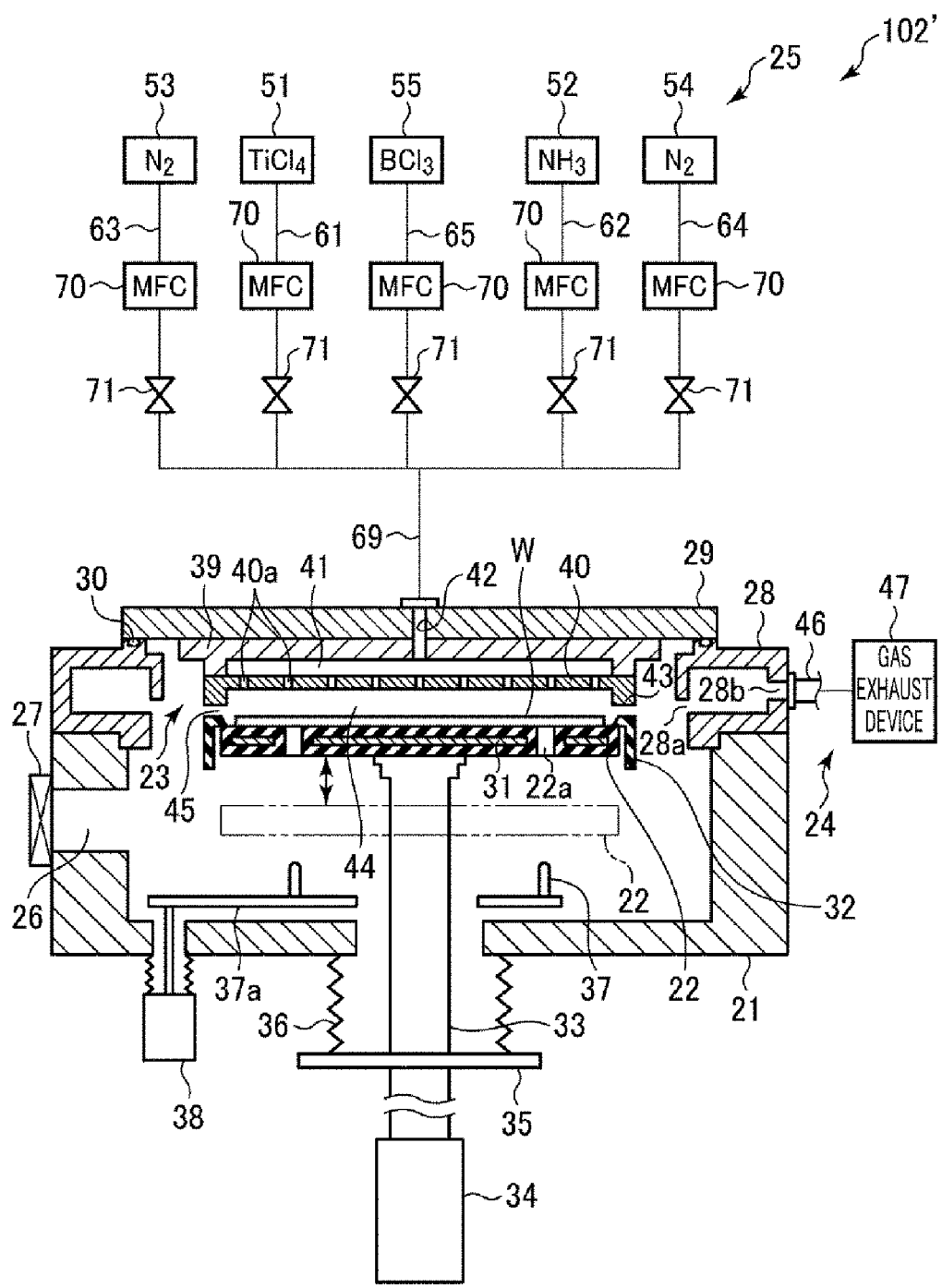
FIG. 16 is a cross sectional view illustrating another example of the film forming apparatus in the film forming system of FIG. 12.

As the film forming system 100, a film forming apparatus 102' configured to form a TiBN film as shown in FIG. 16 may be used instead of the film forming apparatus 102 configured to form the TiN film.

The film forming apparatus 102' has the same configuration as the film forming apparatus 102 except that a $BCl_3$ gas supply source 55 and a $BCl_3$ gas supply line 65 extended from the $BCl_3$ gas supply source 55 are further provided in the processing gas supply device 25. The $BCl_3$ gas supply line 65 is merged into the joint line 69. Further, the $BCl_3$ gas supply line 65 is equipped with a mass flow controller 70 and an opening/closing valve 71.

In the film forming apparatus 102', the gate valve 27 is first opened, and a wafer W is carried into the film forming apparatus 102' from the vacuum transfer chamber by the transfer device. After the transfer device is then retreated, the gate valve 27 is closed, and the susceptor 22 holding the wafer W thereon is raised to the processing position. Subsequently, the inside of the chamber 21 is maintained in a predetermined decompressed state, and the temperature of the susceptor 22 is regulated to a preset temperature by the heater 31.

Then, by intermittently opening and closing opening/closing valves 71 of the $TiCl_4$ gas supply line 61 and the $NH_3$ gas supply line 62 alternately while continuously supplying the $N_2$ gas into the processing space 44 from the first $N_2$ gas supply source 53 and the second $N_2$ gas supply source 54, a series of processes of the supply of the $TiCl_4$ gas→the purge of the inside of the chamber→the supply of the $NH_3$ gas→the purge of the inside of the chamber are performed repeatedly. Accordingly, by repeating the adsorption of the Ti layer as the monoatomic layer and the nitriding of this Ti layer X times, the TiN film having a preset thickness is formed. Subsequently, by intermittently opening and closing opening/closing valves 71 of the $BCl_3$ gas supply line 65 and the $NH_3$ gas supply line 62 alternately while continuously supplying the $N_2$ gas from the first $N_2$ gas supply source 53 and the second $N_2$ gas supply source 54, a series of processes of the supply of the $BCl_3$ gas→the purge of the inside of the chamber→the supply of the $NH_3$ gas→the purge of the inside of the chamber are performed one time or Y times (Y is 2 or more). Accordingly, by repeating adsorption of B as a monatomic layer and nitriding of this B layer Y times, a BN having a required film thickness is formed. By repeating the formation of the TiN film and the formation of the BN film a preset number of times until a required film thickness is obtained, it is possible to obtain a required TiBN film. Here, by adjusting X and Y, a ratio between the TiN and the BN can be adjusted. By way of non-limiting example, by setting X=10 and Y=1, the TiBN film having the ratio of TiN:BN=10:1 is obtained.

At this time, since the surface processing is already performed on the surface of the $SiO_2$ film as the base film and thus the silanol group is formed on the substantially entire surface thereof, Ti can be adsorbed to the substantially entire surface. Thus, the pin hole is not formed, and the TiBN film or the like can be uniformly formed on the substantially entire surface.

At this case, processing conditions are basically the same as those of the film forming apparatus 102. However, a $BCl_3$ gas flow rate is set to range from 20 sccm to 100 sccm (mL/min) and a purge time after the supply of the $BCl_3$ gas is set to range from 0.2 sec to 0.4 sec per one time.

Furthermore, besides the $BCl_3$ gas, $B_2H_6$ or the like may be used as a B source gas.

Second Example

Figure 17:
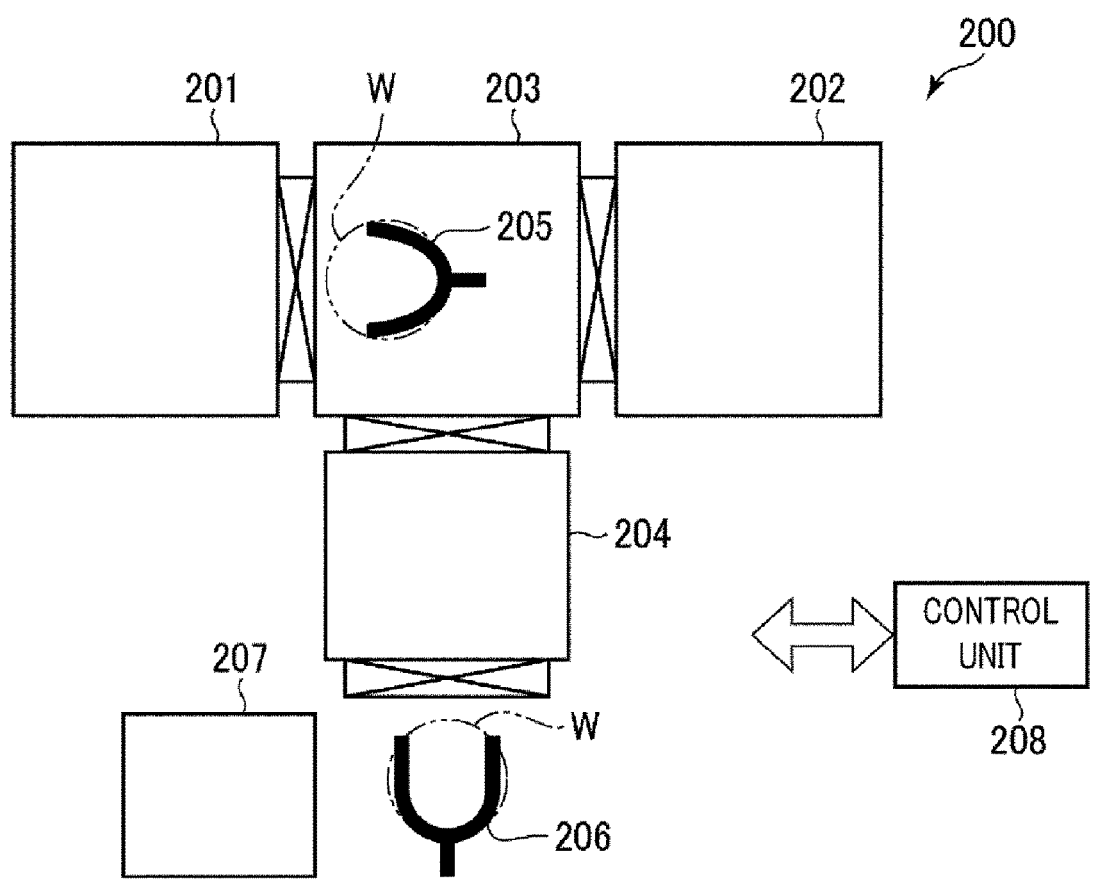
FIG. 17 is a schematic diagram illustrating a second example of a film forming system applicable to the film forming method of the present disclosure.

FIG. 17 is a schematic diagram illustrating a second example of a film forming system. A film forming system 200 according to the present example is configured as a vacuum system in which both a surface processing and a film forming processing are performed as a vacuum processing.

The film forming system 200 includes a surface processing apparatus 201 configured to perform, in a vacuum, a surface processing by dry processing on a SiO$_2$ film as a base film formed on a wafer; a film forming apparatus 202 configured to form a TiN film or a TiBN film, by ALD, on a surface of the SiO$_2$ film of a processing target object, on which the surface processing is performed; a vacuum transfer chamber 203 which is maintained at a vacuum level; a load lock chamber 204; a vacuum transfer device 205 provided within the vacuum transfer chamber 203; a transfer device 206 configured to transfer the wafer between the load lock chamber 204 and a carrier 207 accommodating wafers therein; and a control unit 208.

The vacuum transfer chamber 203 has a rectangular shape, and the surface processing apparatus 201, the film forming apparatus 202 and the load lock chamber 204 are respectively connected to sidewalls of the vacuum transfer chamber 203 via gate valves. The load lock chamber 204 is provided with a gate valve at an atmospheric side as well.

A wafer W taken out of the carrier 207 by the transfer device 206 is transferred into the load lock chamber 204 which is maintained at an atmospheric pressure. Then, after evacuating the load lock chamber 204 to a vacuum level, the wafer W within the load lock chamber 204 is taken out by the vacuum transfer device 205 within the vacuum transfer chamber 203 and is transferred into the surface processing apparatus 201 and the film forming apparatus 202 in sequence. Within the surface processing apparatus 201 and the film forming apparatus 202, the surface processing and the film forming processing are performed on the wafer W in sequence while the vacuum level is maintained therein. The processed wafer W is then transferred into the load lock chamber 204 by the vacuum transfer device 205 and is returned back into the carrier 207 by the transfer device 206.

The control unit 208 includes a main controller having a CPU (computer) configured to control individual components such as the surface processing apparatus 201, the film forming apparatus 202, the vacuum transfer device 205 and the transfer device 206; an input device (a key board, a mouse, etc.); an output device (printer, etc.); a display device (a display, etc.); a storage device; and so forth. As a recording medium storing a processing recipe therein is set in the storage device, the main controller controls the film forming system 200 to perform preset operations based on the processing recipe retrieved from the recording medium. As a result, the preset operations are performed in the film forming system 200 under the control of the CPU (computer).

Figure 18:
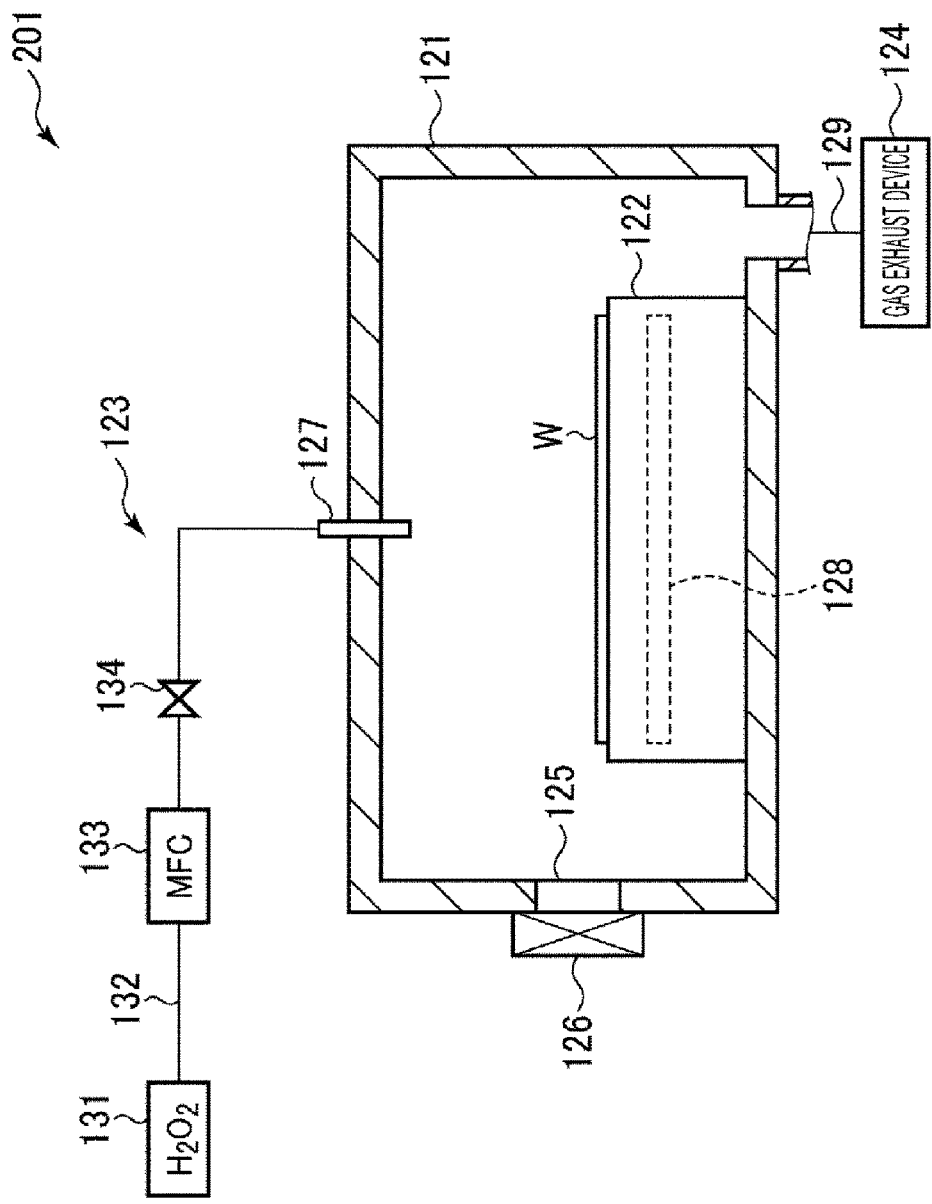
FIG. 18 is a cross sectional view illustrating an example of a surface processing apparatus in the film forming system of FIG. 17.

The surface processing apparatus 201 is configured as a vacuum processing apparatus of a single wafer type, and is equipped with a hermetically sealed chamber 121 as shown in FIG. 18. Within the chamber 121, there is provided a placing table 122 on which the wafer W is placed in a substantially horizontal manner. Further, the surface processing apparatus 201 is further equipped with a gas supply device 123 configured to supply a H$_2$O$_2$ gas (vapor) as a fluid containing O and H into the chamber 121; and a gas exhaust device 124 configured to evacuate the chamber 121.

A carry-in/out opening 125 through which the wafer W is carried in and out with respect to the vacuum transfer chamber by a transfer device (not shown) is provided at a sidewall of the chamber 121. The carry-in/out opening 125 is configured to be opened/closed by a gate valve 126.

A gas inlet nozzle 127 is provided in a ceiling wall of the chamber 121, and the H$_2$O$_2$ gas is supplied into the chamber 121 from the gas supply device 123 through the gas inlet nozzle 127.

The placing table 122 has a substantially circular shape when viewed from the top and is fixed to a bottom portion of the chamber 121. A temperature control mechanism 128 configured to adjust a temperature of the placing table 122 is embedded within the placing table 122. The temperature control mechanism 128 has a temperature control medium path or a heater therein and is configured to adjust the temperature of the placing table 122 to a preset temperature through a heat transfer with respect to a temperature control medium or through heating by the heater.

The gas supply device 123 is equipped with a H$_2$O$_2$ gas supply source 131 configured to supply the H$_2$O$_2$ gas (vapor) as a fluid containing O and H; a pipeline 132 through which the H$_2$O$_2$ gas (vapor) is supplied to the gas inlet nozzle 127 from the H$_2$O$_2$ gas supply source 131; and a mass flow controller 133 and an opening/closing valve 134 provided at the pipeline 132. Beside the H$_2$O$_2$ gas (vapor), a vapor of O$_3$+H$_2$O, a high-temperature vapor of H$_2$O, or the like may be used as the fluid containing O and H.

The gas exhaust device 124 is provided at a gas exhaust line 129 connected to the bottom portion of the chamber 121. The gas exhaust device 124 includes an automatic pressure control valve configured to control a pressure within the chamber 121, a vacuum pump configured to evacuate the chamber 121, and so forth.

In the surface processing apparatus 201 having the above-described configuration, the gate valve 126 is first opened, and the wafer W is carried into the surface processing apparatus 201 from the vacuum transfer chamber 203 by the vacuum transfer device 205 and is placed on the placing table 122. Then, after the vacuum transfer device 205 is retreated, the gate valve 126 is closed, and the inside of the chamber 121 is maintained in a predetermined decompressed state. Further, the temperature of the placing table 122 is controlled to a preset temperature by the temperature control mechanism 128.

In this state, the H$_2$O$_2$ gas (vapor) as the fluid containing O and H is introduced into the chamber 121 from the gas supply device 123 through the gas inlet nozzle 127.

Accordingly, formation of the silanol group on the surface of the SiO$_2$ film of the wafer W is accelerated by the H$_2$O$_2$ gas (vapor) supplied in the chamber 121, so that the silanol group can be formed in the substantially entire surface of the SiO$_2$ film.

The film forming apparatus 202 has the same configuration as the film forming apparatus 102 configured to form the TiN film or the film forming apparatus 102' configured to form the TiBN film of the first example.

The film forming apparatus 202 forms a TiN film or the TiBN film by ALD in the same manner as the film forming apparatuses 102 and 102'. At this time, since the surface processing is already performed on the surface of the SiO$_2$ film on which a TiN film is to be formed, the silanol group as the group containing OH as the reaction site is formed on the substantially entire surface of the SiO$_2$ film. Thus, since Ti can be adsorbed to the substantially entire surface, no pin hole is formed and the TiN film or the like can be formed on the substantially entire surface in a uniform manner.

Third Example

Figure 19:
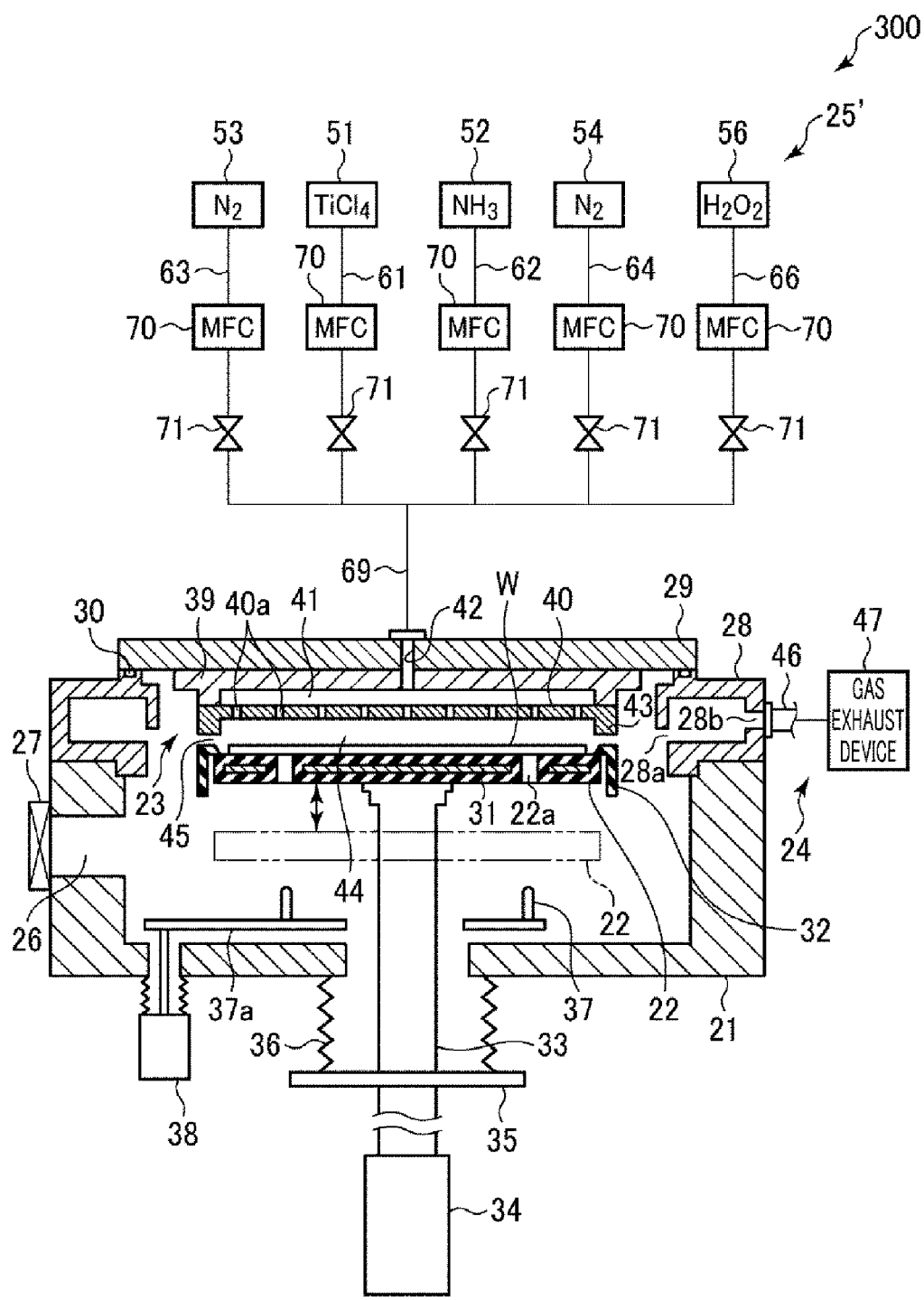
FIG. 19 is a cross sectional view illustrating a third example of a film forming system applicable to the film forming method according to the present disclosure.

FIG. 19 is a cross sectional view illustrating a third example of a film forming system. A film forming system 300 according to the present example includes a surface processing apparatus and a film forming apparatus configured as one body. That is, the film forming system 300 is configured as a system in which a surface processing and a film forming processing are performed as a vacuum processing within a single chamber.

This film forming system 300 is prepared by adding a device configured to supply a $H_2O_2$ gas (vapor) as a fluid containing O and H to the film forming apparatus 102 of FIG. 14. Parts identical to those of FIG. 14 will be assigned same reference numerals, and redundant description will be omitted.

The film forming system 300 includes a processing gas supply device 25'. The processing gas supply device 25' is equipped with a $H_2O_2$ gas supply source 56 in addition to the $TiCl_4$ gas supply source 51, the $NH_3$ gas supply source 52, the first $N_2$ gas supply source 53 and the second $N_2$ gas supply source 54 as included in the processing gas supply source 25 of the film forming apparatus 102. A $H_2O_2$ gas supply line 66 is extended from the $H_2O_2$ gas supply source 56 and merged into the joint line 69. The $H_2O_2$ gas supply line 66 is equipped with a mass flow controller 70 and an opening/closing valve 71.

In the film forming system 300 having the above-described configuration, the gate valve 27 is first opened, and the wafer W having the $SiO_2$ film is carried into the chamber 21 and placed on the susceptor 22. Then, after the transfer device is retreated, the gate valve 27 is closed, and the susceptor 22 is raised to the processing position. Then, the inside of the chamber 21 is maintained in a predetermined decompressed state, and the temperature of the susceptor 22 is controlled to a preset temperature by the heater 31.

Then, first of all, a $H_2O_2$ gas (vapor) as a fluid containing O and H is supplied into the processing space 44 from the $H_2O_2$ gas supply source 56 through the $H_2O_2$ gas supply line 66 and the joint line 69. Accordingly, formation of the silanol group on a surface of the $SiO_2$ film of the wafer W is accelerated, and the silanol group can be formed on the substantially entire surface of the $SiO_2$ film.

Thereafter, while evacuating the chamber by the gas exhaust device 47, the inside of the processing space 44 is purged by supplying the $N_2$ gas into the processing space 44 from the first and second $N_2$ gas supply sources 53 and 54. Then, by intermittently opening and closing opening/closing valves 71 of the $TiCl_4$ gas supply line 61 and the $NH_3$ gas supply line 62 alternately in the state that the $N_2$ gas is continuously supplied into the processing space 44 from the first and second $N_2$ gas supply sources 53 and 54, a series of processes of the supply of the $TiCl_4$ gas→the purge of the inside of the chamber→the supply of the $NH_3$ gas→the purge of the inside of the chamber can be performed repeatedly. By repeating the adsorption of the Ti layer as the monoatomic layer and the nitriding of this Ti layer, the TiN film having a preset thickness is formed. Thus, as in the first and second examples, the TiN film or the like can be formed on the entire surface in a uniform manner.

In the present exemplary embodiment, since the surface processing and the film forming processing can be performed in the single chamber, the apparatus configuration can be simplified, and the processing throughput can be improved.

Furthermore, there may be used a film forming system having a configuration in which the device configured to supply the $H_2O_2$ gas (vapor) as the fluid containing O and H is added to the film forming apparatus 102' configured to form the TiBN film as shown in FIG. 16. Further, besides the $H_2O_2$ gas (vapor), the vapor of $O_3+H_2O$, the high-temperature vapor of $H_2O$, or the like may be used as the fluid containing O and H.

<Other Applications>

Though the exemplary embodiment has been described so far, the exemplary embodiment is not limiting and can be modified in various ways. By way of example, the above-described exemplary embodiment has been described for the example case where the base film is the $SiO_2$ film and the film to be formed is the TiN film or the TiBN film. However, the exemplary embodiment is not limited thereto. For example, the base film may be any of various other kinds of films as long as a group containing OH can be formed on a surface thereof. By way of non-limiting example, another oxide film such as a $Al_2O_3$ film, a $HfO_2$ film, a $ZrO_2$ film, an $Al_2O_3$—$ZrO_2$ film, or the like may be used. Further, a silicon wafer (silicon substrate) may be used as the processing target objet, and silicon may be directly used as the base. In this case well, the group containing OH is the silanol group. Further, a film to be formed only needs to be a metal-containing film that can be formed by using a source gas which reacts with OH on the surface of the base, and it may be another Ti-containing film or a film containing another metal such as Al, W, Cu, or the like.

Further, the above exemplary embodiment has been described for the case where the semiconductor wafer is used as the processing target object. However, the exemplary embodiment is not limited to this example, and the base film may be formed on, by way of example, but not limitation, a glass substrate, a ceramic substrate, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A film forming method of forming a metal-containing film on a base film of a processing target object having a silicon or $SiO_2$ film as the base film by ALD or CVD, the film forming method comprising:
    performing a surface processing of accelerating formation of a group containing OH on a surface of the base film of the processing target object by bringing a fluid containing O and H into contact with the surface of the base film; and
    performing a film forming processing of forming the metal-containing film on the base film, on which the surface processing is performed, by the ALD or the CVD with a film forming source material which reacts with the group containing OH.

2. The film forming method of claim 1,
    wherein the group containing OH is a silanol group.

3. The film forming method of claim 1,
    wherein the metal-containing film is a Ti-containing film.

4. The film forming method of claim 3,
    wherein the metal-containing film is a TiN film or a TiBN film.

5. A film forming method of forming, by ALD or CVD, a Ti-containing film on a base film of a processing target object having a $SiO_2$ film as the base film, the film forming method comprising:

performing a surface processing of accelerating formation of a silanol group on a surface of the $SiO_2$ film by bringing a fluid containing O and H into contact with the surface of the $SiO_2$ film; and performing a film forming processing of forming the Ti-containing film on the $SiO_2$ film, on which the surface processing is performed, by the ALD or the CVD with a Ti source gas which reacts with the silanol group.

6. The film forming method of claim 5, wherein the Ti source gas is $TiCl_4$, and the Ti-containing film is formed by a condensation reaction of the silanol group with the $TiCl_4$.

7. The film forming method of claim 5, wherein the Ti-containing film is a TiN film formed by using the Ti source gas and a nitriding gas.

8. The film forming method of claim 5, wherein the Ti-containing film is a TiBN film formed by using the Ti source gas, a B source gas and a nitriding gas.

9. The film forming method of claim 7, wherein the nitriding gas is $NH_3$.

10. The film forming method of claim 1, wherein the performing of the surface processing is implemented by a wet processing in which a preset aqueous solution as the fluid containing O and H is used and the preset aqueous solution is brought into contact with the surface of the base.

11. The film forming method of claim 10, wherein the preset aqueous solution is selected from a mixed aqueous solution of ammonia water and hydrogen peroxide, a mixed aqueous solution of hydrochloric acid and hydrogen peroxide, an aqueous solution of hydrogen peroxide and a mixed aqueous solution of sulfuric acid and hydrogen peroxide, and a wet cleaning processing is performed as the wet processing.

12. The film forming method of claim 10, wherein the performing of the film forming processing is conducted within two hours after conducting the performing of the surface processing by the wet processing.

13. The film forming method of claim 1, wherein the performing of the surface processing is implemented by a dry processing in which a preset processing gas as the fluid containing O and H is used and the preset processing gas is brought into contact with the surface of the base.

14. The film forming method of claim 13, wherein the preset processing gas is selected from a vapor of $H_2O_2$, a vapor of $O_3+H_2O$, and a high-temperature vapor of $H_2O$.

15. The film forming method of claim 13, wherein, after the performing of the surface processing by the dry processing, the performing of the film forming processing is conducted in-situ.

* * * * *